United States Patent
Iida et al.

(10) Patent No.: US 11,901,288 B2
(45) Date of Patent: Feb. 13, 2024

(54) SEMICONDUCTOR DEVICE AND METHOD OF MANUFACTURING THE SAME

(71) Applicant: RENESAS ELECTRONICS CORPORATION, Tokyo (JP)

(72) Inventors: Tetsuya Iida, Tokyo (JP); Yasutaka Nakashiba, Tokyo (JP); Shinichi Uchida, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 875 days.

(21) Appl. No.: 16/924,968

(22) Filed: Jul. 9, 2020

(65) Prior Publication Data

US 2022/0013457 A1 Jan. 13, 2022

(51) Int. Cl.
*H03F 3/187* (2006.01)
*H01L 23/522* (2006.01)
*H01L 49/02* (2006.01)
*H03M 1/12* (2006.01)
*H03F 3/04* (2006.01)

(52) U.S. Cl.
CPC ...... *H01L 23/5227* (2013.01); *H01L 23/5226* (2013.01); *H01L 28/10* (2013.01); *H03F 3/04* (2013.01); *H03M 1/12* (2013.01)

(58) Field of Classification Search
CPC .................. H03F 3/187; H03F 1/22
USPC ................................. 330/307, 311
See application file for complete search history.

(56) References Cited

U.S. PATENT DOCUMENTS

| | | | |
|---|---|---|---|
| 11,114,377 B2* | 9/2021 | Tanaka | H01F 41/04 |
| 2012/0211864 A1* | 8/2012 | Tanabe | H01L 23/5227 |
| | | | 257/E29.002 |
| 2016/0197066 A1* | 7/2016 | Uchida | H01L 28/10 |
| | | | 438/3 |
| 2018/0375497 A1 | 12/2018 | Hashimoto et al. | |

FOREIGN PATENT DOCUMENTS

JP 2019-009345 A 1/2019

* cited by examiner

*Primary Examiner* — Henry Choe
(74) *Attorney, Agent, or Firm* — Rimon P.C.; Tomoki Tanida

(57) ABSTRACT

A semiconductor device includes a semiconductor substrate, a semiconductor element, and a multilayer wiring. The semiconductor element is formed on the semiconductor substrate. The multilayer wiring includes a wiring electrically connected with the semiconductor element, and a first inductor. The multilayer wiring is formed on the semiconductor substrate such that the multilayer wiring covers the semiconductor element. The first inductor is formed such that the first inductor electrically isolated from the wiring and is magnetically connected with the wiring.

20 Claims, 14 Drawing Sheets

SEMICONDUCTOR DEVICE AND METHOD OF MANUFACTURING THE SAME

BACKGROUND

The present disclosure relates to a semiconductor device and a method, for example, a semiconductor device including an inductor for current sensing, and a method of sensing current.

There is a disclosed technique listed below.

[Patent Document 1] Japanese Unexamined Patent Application Publication No. 2019-009345

A semiconductor device including a resistive element (resistor) is known (for example, Patent Document 1). The resistive element disclosed in Patent Document 1 is constituted by a repetitive pattern of a first conductive part, a second conductive part, and an interlayer conductive part connecting the first conductive part and the second conductive part to each other.

SUMMARY

An exemplary application of the resistive element is a current sensor for measuring the magnitude (current value) of the amount of current in a wiring. When the current is supplied to the resistive element, by detecting a voltage drop occurring between one end of the resistive element another end of the resistor element, the current supplied into the wiring is detected. However, in the current sensor using a resistive element, since Joule heat is generated, power consumption is large. This problem of power consumption becomes more pronounced as the current value increases. Thus, there is a room for improvement in conventional semiconductor device from the viewpoint of enhancing the properties of semiconductor device.

A problem of the present invention is improving the characteristics of a semiconductor device. Other problems and novel features will become apparent from the description of the specification and drawings.

A semiconductor device according to embodiments includes a semiconductor substrate, a semiconductor element formed on the semiconductor substrate and a multilayer wiring formed on the semiconductor substrate such that the multilayer wiring covers the semiconductor element, the multilayer wiring including a wiring electrically connected with the semiconductor element, and a first inductor. The first inductor is electrically isolated from the wiring, and is magnetically connected with the wiring. A method according to embodiments includes (a) providing a semiconductor device including a multilayer wiring in which a wiring and an inductor are formed; (b) supplying a current into the wiring; and (c) detecting an electromotive voltage generated in the inductor when the current is supplied within the wiring.

According to embodiments, the characteristics of the semiconductor device can be improved.

DETAILED DESCRIPTION

Figure 1:
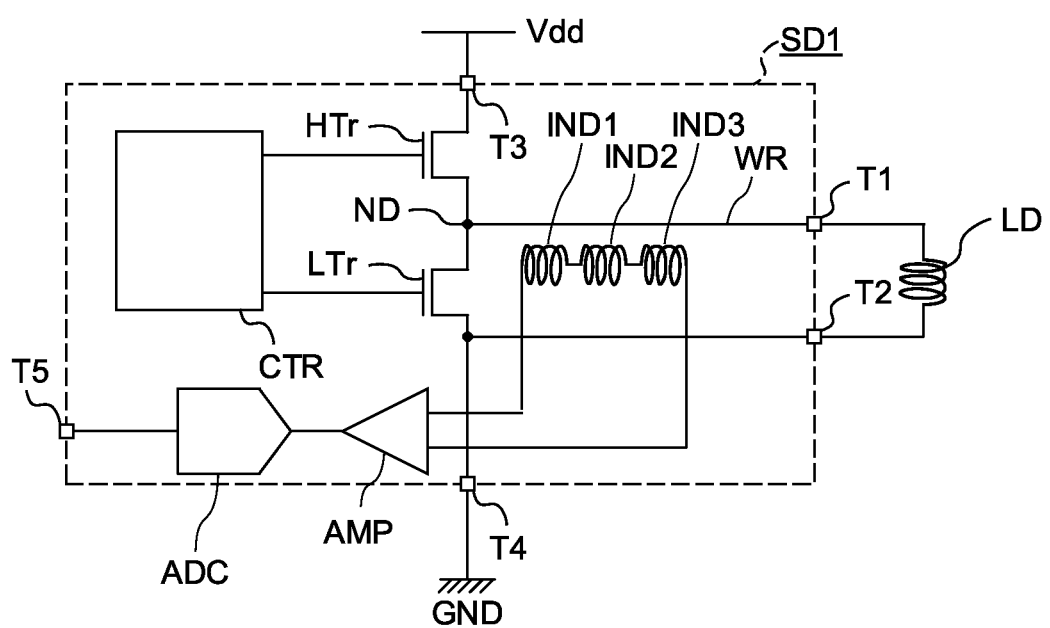
FIG. 1 is a circuit diagram showing an exemplary circuit configuration of a semiconductor device according to a first embodiment.

Hereinafter, a semiconductor device according to embodiments will be described in detail by referring to the drawings. In the specification and drawings, the same or corresponding elements are denoted by the same reference numerals or hatching, and a repetitive description thereof is omitted. In the drawings, for convenience of description, the configuration may be omitted or simplified. A cross-sectional view may also be shown as an end view.

First Embodiment (Circuit Configuration of Semiconductor Device)

FIG. 1 is a circuit diagram showing an exemplary circuit configuration of a semiconductor device SD1 according to a first embodiment.

As shown in FIG. 1, the semiconductor device SD1 includes a controller CTR, a high-side transistor HTr, a low-side transistor LTr, a first inductor IND1, a second inductor IND2, a third inductor IND3, an amplifier circuit AMP, and an AD (Analog-Digital) conversion circuit ADC. The semiconductor device SD1 is coupled with the load LD through a first terminal T1 and a second terminal T2.

In the first embodiment, the high-side transistor HTr, the low-side transistor LTr and the load LD is coupled through a wiring WR. The wiring WR is a wiring that is subject to current sensing.

The controller CTR is coupled with the high-side transistor HTr and the low-side transistor LTr. The controller CTR controls the operation of the high-side transistor HTr and the low-side transistor LTr. For example, the controller CTR, based on a signal received from an external circuit (not shown), controls the operation of the high-side transistor HTr and the low-side transistor LTr. The controller CTR includes, for example, a control circuit.

The high-side transistor HTr is coupled between a power supply line Vdd and a ground line GND. The high-side transistor HTr is coupled with the power supply line Vdd through the third terminal T3. The high-side transistor HTr is electrically coupled with a vicinity of the power supply line Vdd than the low-side transistor LTr. The high-side transistor HTr controls a connection state between the power supply line Vdd and the load LD.

The low-side transistor LTr is coupled between the power supply line Vdd and the ground line GND. The low-side transistor LTr is coupled to the ground line GND through a fourth terminal T4. The low-side transistor LTr is electrically coupled with the vicinity of the ground line GND than the high-side transistor HTr. The low-side transistor LTr controls the connection state between the ground line GND and the load LD.

The load LD is coupled with a node ND between the high-side transistor HTr and the low-side transistor LTr through the wiring WR between the power supply line Vdd and the ground line GND. The load LD is electrically commonly coupled with the high-side transistor HTr and the low-side transistor LTr through the node ND. A configuration of the load LD is not particularly limited. For example, the load LD is a coil that constitutes a solenoid coil. In the first embodiment, the load LD is a coil (inductor).

The first inductor IND1 is configured to be electrically isolated from the wiring WR and be magnetically connected with the wiring WR. The first inductor IND1 is electrically coupled with the first input terminal of the amplifier circuit AMP. In the first inductor IND1, when a current is supplied into the wiring WR via the node ND, an induced electromotive voltage (hereinafter, also simply referred to as electromotive voltage) is generated.

The second inductor IND2 is also configured to be electrically isolated from the wiring WR and be magnetically connected with the wiring WR. The second inductor IND2 is electrically connected between the first inductor IND1 and the third inductor IND3. In the second inductor IND2, an electromotive force is generated when a current is supplied into the wiring WR via the node ND.

The third inductor IND3 is configured to be electrically isolated from the wiring WR and be magnetically connected with the wiring WR. The third inductor IND3 is electrically connected with a second input terminal of the amplifier circuit AMP. The third inductor IND3 is electrically connected with the first inductor IND1 and the second inductor IND2. In the third inductor IND3, an electromotive force is generated when a current is supplied into the wiring WR via the node ND.

The first inductor IND1, the second inductor IND2 and the third inductor IND3 may be connected in series with each other, or may be connected in parallel with each other.

It is preferable that the first inductor IND1, the second inductor IND2 and the third inductor IND3 are connected in series with each other from the viewpoint of increasing the electromotive voltage. In this instance, that is because the magnitude of the electromotive voltage is a sum of an electromotive voltage generated by the first inductor IND1, an electromotive voltage generated by the second inductor IND2, and an electromotive voltage generated by the third inductor IND3.

It is preferable that the first inductor IND1, that second inductor IND2 and the third inductor IND3 are connected in parallel from the viewpoint of reducing noise. That is because a noise in the parallel connection can be reduced by differentially operating the first inductor IND1, the second inductor IND2 and the third inductor IND3 compared with a noise in the series connection.

The amplifier circuit AMP is a circuit for amplifying the received signal. The amplifier circuit AMP includes a first input terminal, a second input terminal and an output terminal. The amplifier circuit AMP amplifies a signal received via the first input terminal and the second input terminal, and outputs from the output terminal. In the first embodiment, the amplifier circuit AMP is electrically coupled with the first inductor IND1, the second inductor IND2 and the third inductor IND3. The first inductor IND1, the second inductor IND2 and the third inductor IND3 are connected in series between a first input terminal of the amplifier circuit AMP and a second input terminal of the amplifier circuit AMP.

The AD conversion circuit ADC is electrically coupled with the output terminal of the amplifier circuit AMP. The AD conversion circuit ADC converts an analog signal received into a digital signal. An output signal from the AD conversion circuit ADC is output toward an outside of the semiconductor device SD1 via a fifth terminal T5.

(Method of Detecting Current)

Figure 2:
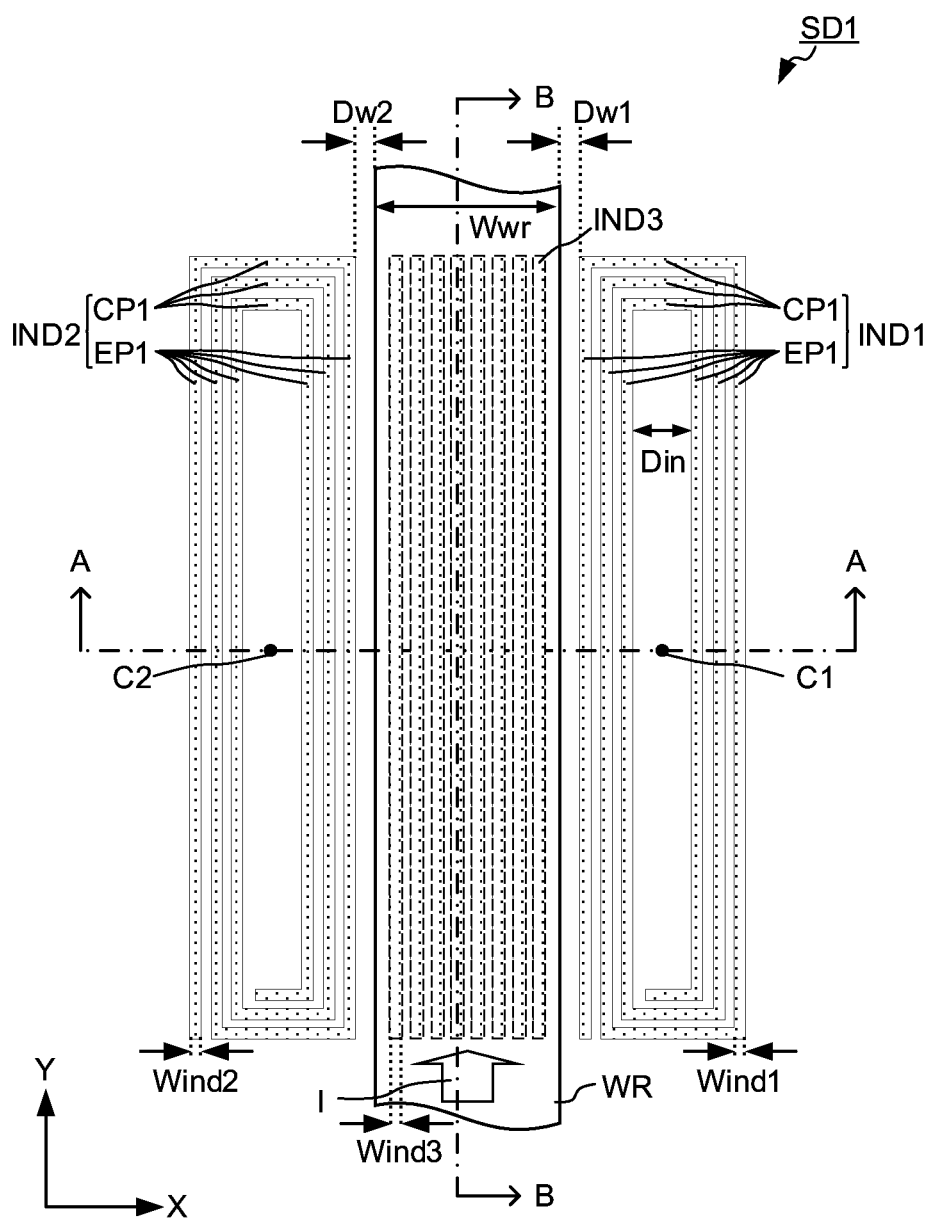
FIG. 2 is a plan view showing an exemplary configuration of a main portion of the semiconductor device according to the first embodiment.

Here, an exemplary operation method of the semiconductor device SD1 (method of detecting current) is described. In the first embodiment, how to detect the current into the wiring WR is described. FIG. 2 is a plan view showing an exemplary configuration of a main portion of the semiconductor device SD1 according to the first embodiment. A white arrow in FIG. 2 shows a direction in which current flows. Due to the current, a magnetic field is generated in a vicinity of the wiring WR in accordance with the right-hand thread law.

The method of detecting current according to the first embodiment includes (1) providing the semiconductor device SD1, (2) supplying a current, and (3) detecting an electromotive voltage.

(1) Providing the Semiconductor Device SD1

First, the semiconductor device SD1 is provided. For example, the semiconductor device SD1 may be purchased or manufactured, as described in greater detail below.

(2) Supplying Current

Subsequently, a current is supplied into the wiring WR. The magnitude of the current (current amount, current value) in accordance with the amount of current required to drive the load LD is appropriately set. In the first embodiment, from the power supply line Vdd, a current is supplied into the wiring WR via the third terminal T3. In this step, the controller CTR controls the high-side transistor HTr and the low-side transistor LTr, then, the current of the desired current value is supplied to wiring WR.

Due to the current supplied into the wiring WR, a magnetic field is generated in the vicinity of the wiring WR. A direction of the magnetic field follows the right-handed law. In the first embodiment, the magnetic field, in FIG. 2, is formed such that the magnetic field penetrates the first inductor IND1 toward a back from a front of a paper surface, penetrates the third inductor IND3 from a right to a left of the paper surface, and penetrate the second inductor IND2 toward the front from the back of the paper surface.

(3) Detecting an Electromotive Voltage

Subsequently, an electromotive voltage is detected. The magnetic field generated in the step of supplying current, an electromotive voltage is generated in the first inductor IND1, the second inductor IND2 and the third inductor IND3 which are formed in the vicinity of the wiring WR. In this step, a signal caused by the electromotive voltage is detected.

More specifically, in the first embodiment, the electromotive voltage generated in the first inductor IND1, the second inductor IND2 and the third inductor IND3 is amplified by the amplifier circuit AMP. Then, the AD conversion circuit ADC converts an analog signal to a digital signal. Finally, a detector (not shown) is used to detect the electromotive voltage after conversion into a digital signal.

The detector may be provided inside the semiconductor device SD1 or may be provided outside the semiconductor device SD1. In the first embodiment, the detector is provided outside the semiconductor device SD1. Although not shown in particular, the detector is electrically connected through the fifth terminal T5 of the semiconductor device SD1.

As described above, in the first embodiment, the amplifying step and the A/D converting step are performed in the semiconductor device SD1 before a signal (induced currents) generated due to the electromotive voltage is taken out of the semiconductor device SD1. When the electromotive voltage is small, it is preferable to amplify the signal by the amplifier circuit AMP. In general, when performing detecting current using a resistive element, the need for amplification processing is small. In contrast, when performing detecting current using an inductor element, the electromotive voltage is small. For this reason, it is preferable that the semiconductor device SD1 includes an amplifier circuit AMP.

In addition, the AD-conversion processing is performed to reduce an effect of noise as compared with the case where an analog signal is taken out from the semiconductor device SD1 as the analog signal. As a result, detection can be performed with high accuracy. From this viewpoint, it is preferable that the semiconductor device SD1 includes the AD conversion circuit ADC.

(Principle of Detecting an Electromotive Voltage)

Here, the principle of detecting the electromotive voltage with the inductor element used is described.

As previously mentioned, when current is supplied to the wiring, a magnetic field is generated in the vicinity of the wiring. If the inductor element is disposed in the magnetic field, the electromotive voltage is generated in the inductor element. At this instance, the relationship between a magnetic flux density B and a current value I in the wiring WR is expressed by the following equation (1) according to Bio-Savar's law.

$$B=\mu I/2\pi r \quad (1)$$

[Here, the μ is a permeability. The r is an interval of the wiring and the inductor.]

A magnetic flux φ is expressed by the following equation (2). Then, an electromotive voltage V generated in the inductor element, by Renz's law, is expressed by the following equation (3).

$$\phi=NBS \quad (2)$$

$$V=-d\phi/dt \quad (3)$$

[Here, the N is the winding number of the inductor element. The S is an area of the inductor element. Here, the area of the inductor element is a size of a region surrounded by a portion located on the outermost periphery among a conductor constituting the inductor element.]

As apparent from the above equation (1), when the r is constant, as a magnitude of the current (current value I) in the wiring increases, the magnetic flux density B of the magnetic field generated in the vicinity of the wiring is increased. As apparent from the above equation (2), when the N and the S is constant, the larger the magnetic flux density B, the magnetic flux φ is increased. As apparent from the above equation (3), when the magnetic flux penetrating the inductor element is changed, the electromotive voltage V is generated in the inductor element. By measuring the magnitude of the electromotive voltage V, it is possible to measure the current value of the current supplied in the wiring.

From the viewpoint of increasing the detection accuracy by increasing the electromotive voltage V, the current value I is preferably large. If the current value is too small, an S/N ratio is reduced, it may not be able to detect the current with high accuracy. From the viewpoint of detecting the current with high accuracy, it is preferable that the current value is 3 A or more. However, when the ambient temperature is 100° C. or more and the wiring is an AL wiring, for example, the current density in the AL wiring is preferably $1\times10^5$ A/μm$^2$ or more and $5\times10^5$ A/μm$^2$ or less. When the ambient temperature is 100° C. or more and the wiring is a copper wiring, it is preferably $1\times10^5$ A/μm$^2$ or more and $2\times10^6$ A/μm$^2$ or less. In other words, when a current density of $1\times10^5$ A/μm$^2$ or more, and the total current value of 3 A or more flows in the wiring, the inductor is configured to be magnetically connected with the wiring.

[Configuration of Semiconductor Device]

Figure 3:
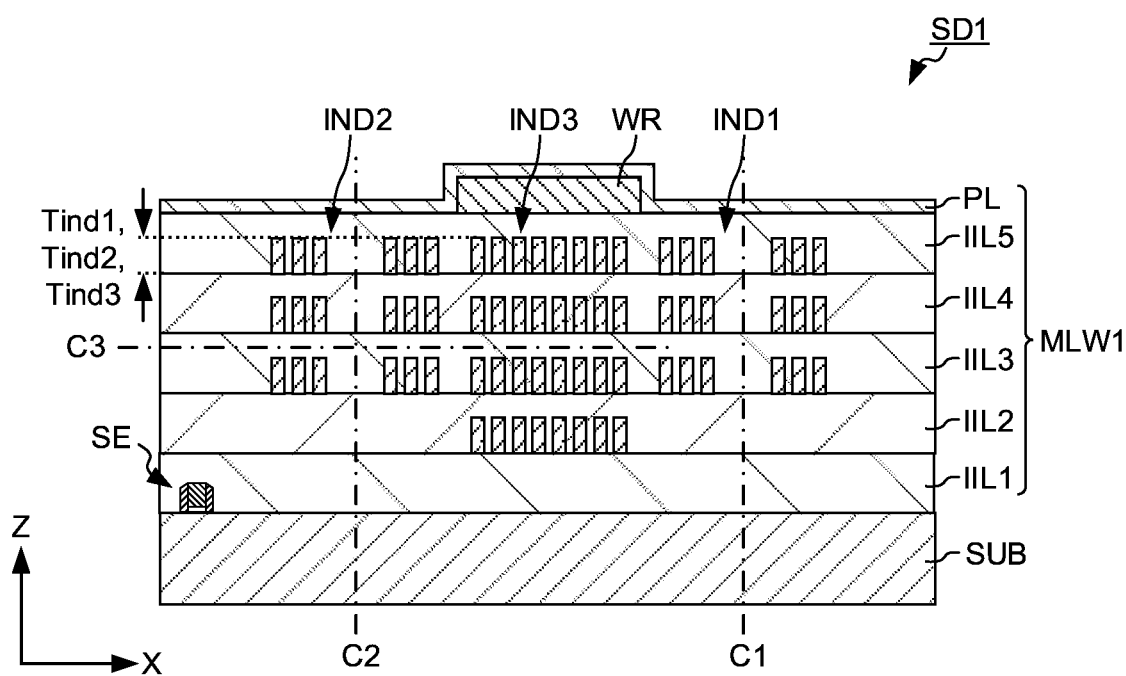
FIG. 3 is a cross-sectional view showing an exemplary configuration of the main portion of the semiconductor device according to the first embodiment.
Figure 4:
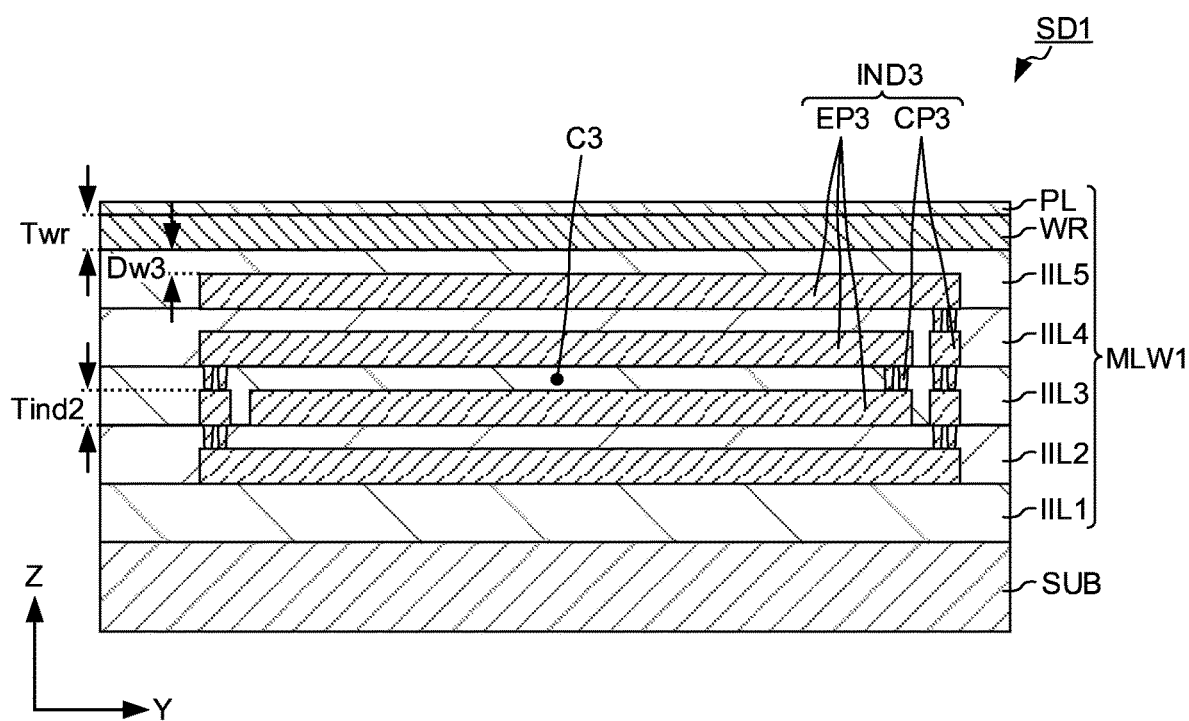
FIG. 4 is a cross-sectional view showing an exemplary configuration of the main portion of the semiconductor device according to the first embodiment.

FIG. 2 is a plan view showing an exemplary configuration of the main portion of the semiconductor device SD1 according to the first embodiment. FIG. 2 shows an exemplary configuration of the semiconductor device SD1 for realizing the above-described circuit configuration of the semiconductor device SD1. FIG. 3 and FIG. 4 are cross-sectional views showing an exemplary configuration of the main portion of the semiconductor device SD1 according to the first embodiment. FIG. 3 is the cross-sectional view taken along line A-A in FIG. 2. FIG. 4 is the cross-sectional view taken along line B-B in FIG. 2. In FIG. 2, from the viewpoint of legibility, only the first inductor IND1, the second inductor IND2, the third inductor IND3 and the wiring WR are shown.

The semiconductor device SD1 includes a semiconductor substrate SUB, a semiconductor element SE, and a multilayer wiring MLW1. The multilayer wiring MLW1 includes the wiring WR, the first inductor IND1, the second inductor IND2, and the third inductor IND3, which will be described in detail later. Although not shown in particular, the amplifier circuit AMP and the AD conversion circuit ADC may be formed on the semiconductor substrate SUB.

Incidentally, "X direction" is a width direction of the wiring WR in plan view. "Y direction" is also an extending direction of the wiring WR in plan view. "Z direction" is a thickness direction of the wiring WR. Incidentally, X direction, Y direction and Z direction are orthogonal to each other. Here, the wiring WR is a wiring of multilayer wiring MLW1 that is a target of detecting current by the first inductor IND1, the second inductor IND2, and the third inductor IND3.

The semiconductor substrate SUB is, for example, p-type semiconductor substrate containing p-type impurities, or n-type semiconductor substrate containing n-type impurities. Examples of the p-type impurities include boron (B) and aluminum (Al) Examples of the n-type impurities include arsenic (As) and phosphorus (P).

The semiconductor element SE is formed on the semiconductor substrate SUB. The semiconductor element SE constitutes an optional circuit in the semiconductor device SD1. The type of the semiconductor element SE is not particularly limited. The semiconductor element SE may be a high-side transistor HTr or a low-side transistor LTr described above. The semiconductor element SE may be a part of the amplifier circuit AMP or an AD conversion circuit ADC described above.

The semiconductor element SE is formed so as not to be affected by the magnetic field occurring in the vicinity of the wiring WR. For example, the semiconductor element SE, in a plan view, it is preferably formed without overlapping with the wiring WR. It is preferable that the semiconductor element SE is formed without overlapping with the first inductor IND1, the second inductor IND2, and third inductor IND3 in plan view.

The multilayer wiring MLW1 is formed on the semiconductor substrate SUB such that the multilayer wiring MLW1 covers the semiconductor element SE. The multilayer wiring MLW1 is constituted by two or more wiring layers. The wiring layer is a layer including an interlayer insulating layer and one or both of a wiring and a via that are formed in the interlayer insulating layer. The via is a conductive member that electrically connects two wirings formed in layers that differ from each other.

The multilayer wiring MLW1 includes a first interlayer insulating layer IIL1, a second interlayer insulating layer IIL2, a third interlayer insulating layer IIL3, a fourth interlayer insulating layer IIL4, a fifth interlayer insulating layer IIL5, the wiring WR, the first inductor IND1, the second inductor IND2, the third inductor IND3, and the protective layer PL.

The first interlayer insulating layer IIL1, the second interlayer insulating layer IIL2, the third interlayer insulating layer IIL3, the fourth interlayer insulating layer IIL4, and the fifth interlayer insulating layer IIL5 are formed on the semiconductor substrate SUB in this order. Examples of materials for each of the first interlayer insulating layer IIL1, the second interlayer insulating layer IIL2, the third interlayer insulating layer IIL3, the fourth interlayer insulating layer IIL4, and the fifth interlayer insulating layer IIL5 include silicon oxide. The thicknesses of the first interlayer insulating layer IIL1, the second interlayer insulating layer IIL2, the third interlayer insulating layer IIL3, the fourth interlayer insulating layer IIL4, and the fifth interlayer insulating layer IIL5 are not particularly limited.

The wiring WR is electrically connected with the semiconductor element SE. The wiring WR is electrically isolated from the first inductor IND1, the second inductor IND2, and the third inductor IND3. In the first embodiment, the wiring WR is formed such that the wiring WR is spaced apart from the first inductor IND1 and the third inductor IND3. Thus, the wiring WR is electrically isolated from the first inductor IND1 and the third inductor IND3. The wiring WR is electrically insulated from the second inductor IND2 through the fifth interlayer insulating layer IIL5. Increasing the amount of current in the wiring WR, from the viewpoint of increasing the detection accuracy, a thickness Twr of the wiring WR is preferably large. The thickness Twr of the wiring WR, a thickness Tind1 of the first inductor IND1, a thickness Tind2 of the second inductor IND2, and is preferable the same or more than a thickness Tind3 of the third inductor IND3.

Increasing the amount of current in the wiring WR, from the viewpoint of increasing the detection accuracy of the current, a width Wwr of the wiring WR is preferably large. For example, the width Wwr of the wiring WR is preferably greater than a width Wind1 of the first inductor IND1, a width Wind2 of the second inductor IND2, and a width Wind3 of the third inductor IND3.

The wiring WR is, for example, a laminated film in which a barrier metal, a conductive film and a barrier metal are stacked in this order. Examples of materials constituting the barrier metal include titanium (Ti), titanium nitride (TiN), tantalum (Ta) and tantalum nitride (TaN). Examples of materials of the conductive film include aluminum and copper. From the viewpoint of flowing current with a large current value in the wiring WR, the material of the wiring WR is preferably copper.

From the viewpoint of flowing current with a large current value in the wiring WR, the wiring WR is preferably the uppermost wiring in the multilayer wiring MLW1. In this instance, the wiring WR directly contacts with the fifth interlayer insulating layer IIL5 and the protective layer PL.

The first inductor IND1 is configured to be electrically isolated from the wiring WR, and be magnetically coupled. The first inductor IND1 is formed in the vicinity of the wiring WR without contacting with the wiring WR. A configuration for the first inductor IND1 being magnetically connected with the wiring WR, It is appropriately adjusted in accordance with the current value of the current in the wiring WR, the winding number of the first inductor IND1, and a distance between the wiring WR and the first inductor IND1 and the like. Hereinafter, the configuration of the first inductor IND1 will be described in detail.

The first inductor IND1, in plan view, in the X-direction, adjacent the wiring WR. The first inductor IND1, in plan view, is formed without overlapping with the wiring WR. From the viewpoint of increasing the accuracy of current detecting by the first inductor IND1, in the X-direction, a distance Dw1 between the first inductor IND1 and the wiring WR is preferably small. For example, the distance Dw1 is preferably less than a width Wwr of the wiring WR. The distance Dw1 is, for example, 2.5 μm or less, and more preferably 1 μm or less. On the other hand, if the first inductor IND1 and the wiring WR are formed in the same layer with each other, from the viewpoint of suppressing a short circuit between the first inductor IND1 and the wiring WR, it is preferable that the distance Dw1 is large. For example, the distance Dw1 is preferably greater than a width Wind1 of the first inductor IND1. The distance Dw1 is, for example, preferably 0.25 μm or more, and more preferably 0.5 μm or more. The distance Dw1 is appropriately adjusted in accordance with the current value of the current supplied in the wiring WR.

The first inductor IND1 may be formed in the same layer as a layer in which the wiring WR is formed, or may be formed in a layer different from the layer in which the wiring WR is formed. From the viewpoint of enhancing the magnetic interaction between the first inductor IND1 and the wiring WR while enhancing an insulating property between the first inductor IND1 and the wiring WR, the first inductor IND1 is preferably formed in a layer different from the layer in which the wiring WR is formed. In the first embodiment, in the Z-direction, a distance of the first inductor IND1 and the semiconductor substrate SUB is less than the distance of the wiring WR and the semiconductor substrate SUB.

From the viewpoint of increasing the accuracy of the current detecting, the winding number of the first inductor IND1 is preferably large. The winding number of the first inductor IND1 may be adjusted in accordance with the current value of the current supplied in the wiring WR. For example, if the current value of the current supplied in the wiring WR is small, it is preferable that the winding number of the first inductor IND1 is large. The winding number of the first inductor IND1 is, for example, preferably 50 times or more, and more preferably 130 times or more. On the other hand, from the viewpoint of realizing miniaturization of the first inductor IND1, it is preferable that the winding number of the first inductor IND1 is small. The winding number of the first inductor IND1 is preferably 250 or less, for example, and more preferably 200 or less.

From the viewpoint of reducing a resistance of the first inductor IND1, it is preferable that a thickness Tind1 of the first inductor IND1 is large. The thickness Tind1 of the first inductor IND1 is preferably 0.2 µm or more, more preferably 0.3 µm or more.

From the viewpoint of reducing the resistance of the first inductor IND1, it is preferable that a width Wind1 of the first inductor IND1 is large. The width Wind1 of the first inductor IND1 is preferably 0.18 µm or more, more preferably 0.24 µm or more. From the viewpoint of realizing miniaturization of the first inductor IND1 while increasing the winding number of the first inductor IND1, it is preferable that the width Wind1 of the first inductor IND1 is small. For example, the width Wind1 of the first inductor IND1 is preferably smaller than the width Wwr of the wiring WR. The width Wind1 of the first inductor IND1 is preferably 1 µm or less, more preferably 0.5 µm or less.

In the first embodiment, the first inductor IND1 includes a plurality of extending portions EP1 and a plurality of connecting portions CP1. Also, although not shown in particular, the first inductor IND1 also includes a via for connecting the two extending portion EP1 formed in different layers from each other.

The plurality of extending portions EP1 extend along the Y-direction. The connecting portion CP1 connects two extending portions EP1 adjacent with each other in the X-direction among the plurality of extending portions EP1. A shape of the first inductor IND1 including the plurality of extending portions EP1 and the plurality of connecting portions CP1, in plan view, a spiral shape. A center axis C1 of the first inductor IND1 is along a normal line to a main surface of the semiconductor substrate SUB. The center axis C1 of the first inductor IND1, in plan view, is located on the center of the area surrounded by two extending portions EP1 and two connecting portions CP1 located at innermost of the first inductor IND1. Here, the main surface of the semiconductor substrate SUB is a forming surface of the semiconductor element SE, an upper surface of the semiconductor substrate SUB.

The extending portion EP1 of the first inductor IND1, in plan view, extends along the Y-direction. In plan view, if the extending portion EP1 extends along the wiring WR, an interaction between the magnetic field and the first inductor IND1 caused by the current flowing via the wiring WR is increased. From the viewpoint of increasing the accuracy of the current detecting, it is preferable that the extending portion EP1 extends along the wiring WR.

From the viewpoint of improving the accuracy of current detecting, it is preferable that a length of the extending portion EP1 in the Y-direction is large. For example, the length of the extending portion EP1 in the Y direction is preferably greater than the length of the connecting portion CP1 in the X direction. In other words, in the X-direction, an inner diameter Din of the first inductor IND1 is preferably small. Thus, in the X direction, a distance between the wiring WR and the extending portion EP1 formed at a position farther from the wiring WR among the plurality of extending portions EP1 is reduced, it is possible to enhance the magnetic interaction between wiring WR and the extending portion EP1 formed at a position farther from the wiring WR among the plurality of extending portions EP1. Thus, it is possible to increase the accuracy of the current detection. From this viewpoint, in the X direction, the inner diameter Din of the first inductor IND1 is preferably smaller than the width Wwr of the wiring WR. The inner diameter Din of the first inductor IND1 in the X-direction is preferably, for example, 30 µm or less, and more preferably 15 µm or less.

The shape of the first inductor IND1, as described above, is the spiral shape. More specifically, the shape of a region of a peripheral portion of the first inductor IND1, when the first inductor IND1 is viewed from the central axis C1 of the first inductor IND1, it is preferable a substantially rectangular shape or substantially oval shape. Thus, as compared with when the shape of the first inductor IND1 is square or circular, it is possible to increase a ratio of the extending portion EP1 constituting the first inductor IND1, it is possible to increase the accuracy of the current detecting.

The materials of the first inductor IND1 are not particularly limited. The first inductor IND1, for example, is a laminated film in which a barrier metal, a conductive film and a barrier metal are stacked in this order. Examples of materials of the barrier metal include titanium (Ti), titanium nitride (TiN), tantalum (Ta) and tantalum nitride (TaN). Examples of materials off the conductive film include aluminum and copper. From the viewpoint of reducing the resistance of the first inductor IND1, the material of the first inductor IND1 is preferably copper.

The second inductor IND2 is also configured to be electrically isolated from the wiring WR and be magnetically connected with the wiring WR. When viewed in a plan view, the second inductor IND2 is adjacent to the wiring WR in the X-direction. That is, the second inductor IND2 is formed such that the wiring WR is located between the first inductor IND1 and the second inductor IND2 in plan view. A central axis C2 of the second inductor IND2 is along a normal line to the main surface of the semiconductor substrate SUB.

As described above, the second inductor IND2 is electrically connected with the first inductor IND1. The second inductor IND2 may be directly connected with the first inductor IND1, or may be indirectly connected. In present embodiment, the second inductor IND2 is indirectly connected with the first inductor IND1 via third inductor IND3. A winding direction of the second inductor IND2 is not particularly limited. The winding direction of the second inductor IND2 is appropriately adjusted in accordance with connecting mode between the first inductor IND1 and the third inductor IND3.

Elements (extending portion EP2 and connecting portion CP2) of the second inductor IND2, the thickness Tind2, the width Wind2, the winding number, the distance Dw2, the shape, the inner diameter and the material and the like is similar to the first inductor IND1.

The third inductor IND3 is configured to be electrically isolated from the wiring WR and be magnetically connected with the wiring WR. The third inductor IND3 is formed in a vicinity of the wiring WR without contacting the wiring WR. A configuration for the third inductor IND3 being magnetically connected with the wiring WR is appropriately adjusted in accordance with the current value of the current in the wiring WR, the winding number of the third inductor IND3, and a distance between the wiring WR and the third inductor IND3 and the like. Hereinafter, the configuration of the third inductor IND3 is described in detail.

At least a portion of the third inductor IND3, in plan view, overlaps with the wiring WR. From the viewpoint of increasing the accuracy of current detecting by the third inductor IND3, it is preferable that an entire of the third inductor IND3, in a plan view, overlaps with the wiring WR.

From the viewpoint of increasing the accuracy of current detecting by the third inductor IND3, in the Z-direction, the distance Dw3 between the third inductor IND3 and the wiring WR is preferably small. For example, the distance Dw3 is preferably less than the thickness Twr of the wiring WR. The distance Dw3 is, for example, preferably 1 µm or less, and more preferably 0.5 µm or less. On the other hand, from the viewpoint of suppressing the short circuit between the third inductor IND3 and the wiring WR, it is preferable that the distance Dw3 is large. For example, the distance Dw3 is preferably greater than the thickness Tind3 of the third inductor IND3. The distance Dw3 is, for example, preferably 0.8 µm or more, and more preferably 1 µm or more. The distance Dw3 is appropriately adjusted in accordance with the current value of the current supplied in the wiring WR.

The third inductor IND3 may be formed in a layer closer to the semiconductor substrate SUB than the layer in which the wiring WR is formed, or may be formed in a layer farther from the semiconductor substrate SUB than the layer in which the wiring WR is formed. From the viewpoint of increasing the accuracy of the current detecting, it is preferable that the wiring WR is formed at an uppermost layer in multilayer wiring MLW1. That is, the third inductor IND3 is preferably formed in a layer of multilayer wiring MLW1 closer to the semiconductor substrate SUB than the layer in which the wiring WR is formed. In the first embodiment, the third inductor IND3 is formed in the second interlayer insulating layer IIL2, the third interlayer insulating layer IIL3, the fourth interlayer insulating layer IIL4, and the fifth interlayer insulating layer IIL5.

From the viewpoint of increasing the accuracy of the current detecting, the winding number of the third inductor IND3 is preferably large. The winding number of the third inductor IND3 may be adjusted in accordance with the magnitude of the current value of the current supplied in the wiring WR. For example, if the current value of the current supplied in the wiring WR is small, it is preferable that the winding number of the third inductor IND3 is large. The winding number of the third inductor IND3 is appropriately adjusted in accordance with the width Wwr of the wiring WR. The winding number of the third inductor IND3 is, for example, preferably 50 or more, and more preferably 130 or more.

From the viewpoint of reducing the resistance of third inductor IND3, it is preferable that the thickness Tind3 of the third inductor IND3 is large. Examples of the thickness Tind3 of the third inductor IND3 is similar to the thickness Tind1 of the first inductor IND1.

From the viewpoint of reducing the resistance of the third inductor IND3, it is preferable that the width Wind3 of the third inductor IND3 is large. Examples of the width Wind3 of the third inductor IND3 is similar to the width Wind1 of the first inductor IND1.

In the first embodiment, the third inductor IND3 includes a plurality of extending portions EP3 and a plurality of connecting portions CP3. Also, although not shown in particular, the third inductor IND3 also includes a wiring for connecting two extending portions EP3 adjacent to each other in the same layer.

A plurality of extending portions EP3 are formed on each of the inter-layer insulating layers. Examples of the material of the extending portions EP3 are similar to the material of the wiring WR. The extending portion EP3 extends along the Y-direction in plan view. In plan view, if the extending portion EP3 extends along the wiring WR, the interaction between the magnetic field and the third inductor IND3 caused by the current flowing via the wiring WR is increased. From the viewpoint of increasing the accuracy of the current detecting, it is preferable that the extending portion EP3 extends along the wiring WR.

From the viewpoint of improving the accuracy of current detecting, it is preferable that a length of the extending portion EP3 in the Y-direction is large. For example, the length of the extending portion EP3 in the Y direction is preferably greater than a length of the connecting portion CP3 in the Z direction. The greater the length of the extending portion EP3, the greater the magnetic interaction with wiring WR, because the induced electromotive voltage increases.

The connecting portion CP3 connects two extending portions EP3 adjacent to each other in the Z-direction among the plurality of extending portions EP3. The connecting portion CP3 is constituted by a wiring and a via. In the connecting portion CP3, one or more of wirings and one or more of vias are alternately formed. The connecting portion CP3 may be formed of only the via. As a configuration of the via, a configuration adopted as a via in a semiconductor technology can be adopted. The first via, for example, includes a barrier film and a conductive film formed on the barrier film. Examples of materials of the barrier film include titanium (Ti), titanium nitride (TiN), tantalum (Ta), and tantalum nitride (TaN). The material of the conductive film is, for example, tungsten (W), aluminum (Al), or copper (Cu).

A shape the third inductor including a plurality of extending portions EP3 and a plurality of connecting portions CP3, in a cross section through wiring WR and along the Y direction, is a spiral shape. As shown in FIGS. 3 and 4, a central axis C3 of the third inductor IND3, in the cross section, located on the center of the area surrounded by two extending portions EP3 (wiring) and two connecting portions CP3 (wiring and via) located at innermost of the third inductor IND3. The central axis C3 of the third inductor IND3 is along the main surface of the semiconductor substrate SUB.

The shape of the third inductor IND3, as described above, is a spiral shape. More specifically, it is preferable that the shape of the third inductor IND3 is, when viewed the third inductor IND3 from the central axis C3 of the third inductor IND3, a substantially rectangular shape. Thus, as compared with when the shape of the third inductor IND3 is a square shape, it is possible to increase the ratio of the extending portions EP3 constituting the third inductor IND3, and to increase the accuracy of the current detecting.

The protective layer PL is a layer for protecting the semiconductor device SD from external moisture and the like. The protective layer PL is formed on the fifth interlayer insulating layer IIL5 such that the protective layer PL covers the wiring WR. The protective layer PL is formed in an uppermost layer of multilayer wiring MLW1 in the multilayer wiring layer MLW1. The protective layer PL may be a single layer film or a stacked film of two or more layers. Examples of the protective layer PL include a silicon oxide film, a silicon oxynitride film, a silicon nitride film, a Phospho Silicate Glass (PSG) film, and a stacked film of these films. The thickness of the protective layer PL is, for example, 1.0 µm or more and 2.0 µm or less, and is preferably about 1.5 µm.

[Method of Manufacturing Semiconductor Device]

Next, an exemplary method of manufacturing the semiconductor device SD1 according to the embodiment will be described. Method of manufacturing the semiconductor device SD1 includes, for example, (1) providing a semiconductor wafer, (2) forming a semiconductor element SE, and (3) forming multilayer wiring MLW1.

(1) Providing a Semiconductor Wafer

First, a semiconductor wafer is provided. The semiconductor wafer may be purchased as a commercial product or manufactured. The semiconductor wafer provided is fixed to an electrostatic chuck.

(2) Forming a Semiconductor Element

Subsequently, a semiconductor element SE is formed on a main surface of the semiconductor wafer. As a method of forming the semiconductor element SE, for example, a method of forming a MISFET known in the semiconductor technology is employed.

(3) Forming the Multilayer Wiring MLW1

Next, the multilayer wiring MLW1 is formed on the semiconductor wafer so as to cover the semiconductor element SE. As a method of forming the multilayer wiring MLW1, a method known as a method of forming a multilayer wiring in the semiconductor technology can be adopted.

The first interlayer insulating layer IIL1, the second interlayer insulating layer IIL2, the third interlayer insulating layer IIL3, the fourth interlayer insulating layer IIL4, the fifth interlayer insulating layer IIL5, and the protective layer PL are formed by, for example, a CVD method. The extending portion EP1 and the connecting portion CP1 of the first inductor IND1, the extending portion EP2 and the connecting portion CP2 of the second inductor IND2, the extending portion EP3 and the connecting portion CP3 (wiring) of the third inductor IND3, and the wiring WR are formed by, for example, forming a conductive film by a sputtering method, and then patterning the conductive film into a desired shape. The connecting portion CP3 of the third inductor IND3 (via) after forming a through hole in a predetermined interlayer insulating layer, is formed by burying the through hole with a conductive material.

Finally, the structure obtained by the above steps is detached from the electrostatic chuck and diced to obtain a plurality of semiconductor devices SD1 singulated. Finally, the semiconductor device SD1 is sealed with a sealing resin.

[Simulation 1]

Figure 5:
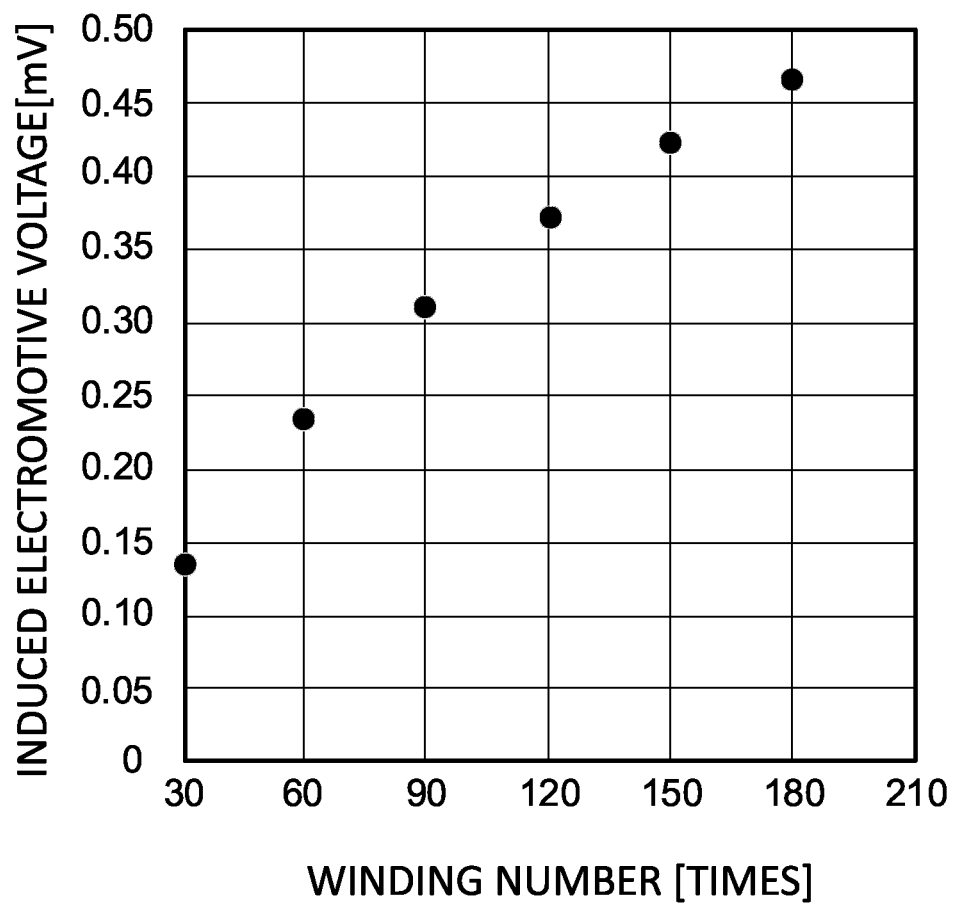
FIG. 5 is a graph showing relationship between the winding number of a first inductor and an induced electromotive voltage.

Here, in order to investigate the relationship between the winding number of the first inductor IND1 and the induced electromotive voltage, a simulation 1 is performed. FIG. 5 is a graph showing relationship between the winding number of the first inductor IND1 and an induced electromotive voltage.

A condition in the simulation 1 is as follows.

The inner diameter Din (X-direction) of the first inductor IND1: 30 µm

The length of the extending portion EP1 (innermost periphery) of the first inductor IND1: 1000 µm The width Wind1 of the first inductor IND1: 1 µm The distance of adjacent wirings constituting the first inductor IND1: 0.1 µm The width Wwr of the wiring WR: 100 µm The distance Dw1 of the wiring WR and the first inductor IND1: 1 µm The current value of the current supplied to the wiring WR: 3 A Frequency of the current supplied to the wiring WR: 3 kHz As shown in FIG. 5, the greater the winding number of the first inductor IND1, it can be seen that the induced electromotive voltage increases. Depending on the performance of the amplifier circuit AMP, an electromotive voltage greater than or equal to a predetermined magnitude may be required. For example, when the threshold voltage of the amplifier circuit AMP is 0.2 mV or more, it is preferable that the winding number of the first inductor IND1 is about 50 or more under the condition of this simulation. On the other hand, when the threshold voltage of the amplifier circuit AMP is 0.4 mV or more, the winding number of the first inductor IND1 is preferably about 130 or more. Incidentally, in the first embodiment, "can be magnetically connected" is, for example, to magnetically interact to the extent that can generate an induced electromotive voltage equal to or greater than the threshold voltage of the amplifier circuit AMP.

On the other hand, the greater the winding number of the first inductor IND1, it can be seen that the increasing rate of the induced electromotive voltage is reduced. The cause of this is considered as follows. As the winding number of the first inductor IND1 increases, the ratio of the portion located farther from the wiring WR increases. In the above portion located farther from the wiring WR, the magnetic interaction with the wiring WR is smaller than in the portion closer to the wiring WR. Therefore, as the winding number of the first inductor IND1 increases, the increasing rate of the induced electromotive voltage is considered to be small.

Thus, the semiconductor device SD1 preferably includes both the first inductor IND1 and the third inductor IND3. When trying to obtain a desired electromotive voltage in only the first inductor IND1, the winding number of the first inductor IND1 is increased, the first inductor IND1 is enlarged. Consequently, the semiconductor device SD1 becomes larger. On the other hand, when the semiconductor device SD1 includes both the first inductor IND1 and the third inductor IND3, it is possible to obtain a desired electromotive voltage with the first inductor IND1 and third inductor IND3 which have a small winding number. As a result, the semiconductor device SD1 can be miniaturized.

[Simulation 2]

Figure 6:
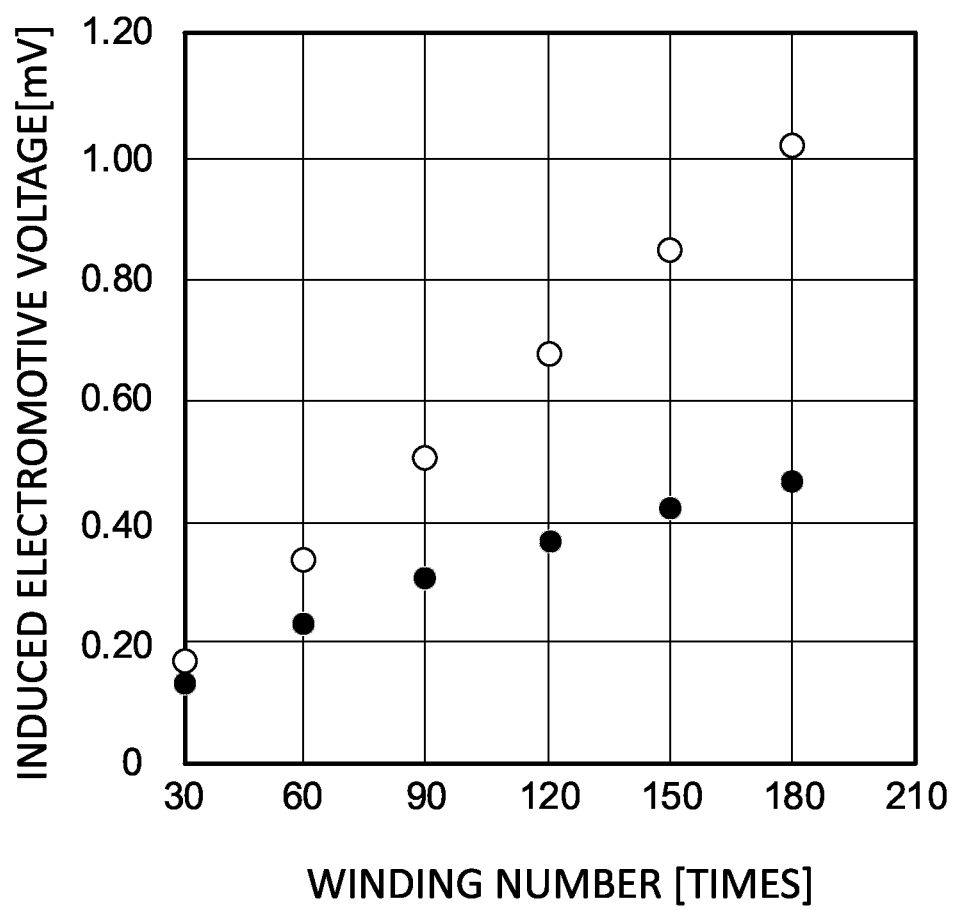
FIG. 6 is a graph showing a relationship between the respective winding number of the first inductor and a third inductor and the induced electromotive force.

Then, to further investigate the relationship between the winding number of the third inductor IND3 and the induced electromotive voltage, a simulation 2 is performed. The third inductor IND3, in that the third inductor IND3 is formed over a plurality of interlayer insulating layers, differs from the first inductor IND1. FIG. 6 is a graph showing the relationship between the winding number of the first inductor IND1 and the third inductor IND3, respectively, and the induced electromotive voltage. A black circle indicates the simulated result of the first inductor IND1. The white circle indicates the simulated result of the third inductor IND3.

As shown in FIG. 6, as compared to the first inductor IND1, it can be seen that the induced electromotive voltage occurring in the third inductor IND3 is greater. The third inductor IND3, in plan view, is formed such that the third inductor IND3 overlaps with the wiring WR. Compared to the first inductor IND1, the third inductor IND3 can be formed closer to the wiring WR. Therefore, among the first inductor IND1, in a portion farther from the wiring WR, whereas the magnetic interaction is weakened, in the third inductor IND3, an entire of the third inductor IND3 is strongly magnetically can interact with the wiring WR. As a consequence, the induced electromotive voltage of the third inductor IND3 is large compared to the first inductor IND1. Therefore, if the semiconductor device SD1 includes only one of the first inductor IND1 and the third inductor IND3, the semiconductor device SD1 preferably includes the third inductor IND3 than the first inductor IND1.

(Effect)

The semiconductor device SD1 according to the first embodiment includes the first inductor IND1, second inductor IND2 and third inductor IND3 which are configured to be electrically isolated from the wiring WR, and be magnetically connected with the wiring WR. In the semiconductor device SD1, the induced electromotive voltage generated in the first inductor IND1, the second inductor IND2, and the third inductor IND3 is detected when a current is supplied into the wiring WR. Therefore, Joule heat generated when performing current detection using a resistor element is not generated. As a result, in the semiconductor device SD1, the consumed power can be suppressed. As a result, the characteristics of the semiconductor device SD1 can be enhanced in the first embodiment.

First Modification of First Embodiment

Figure 7:
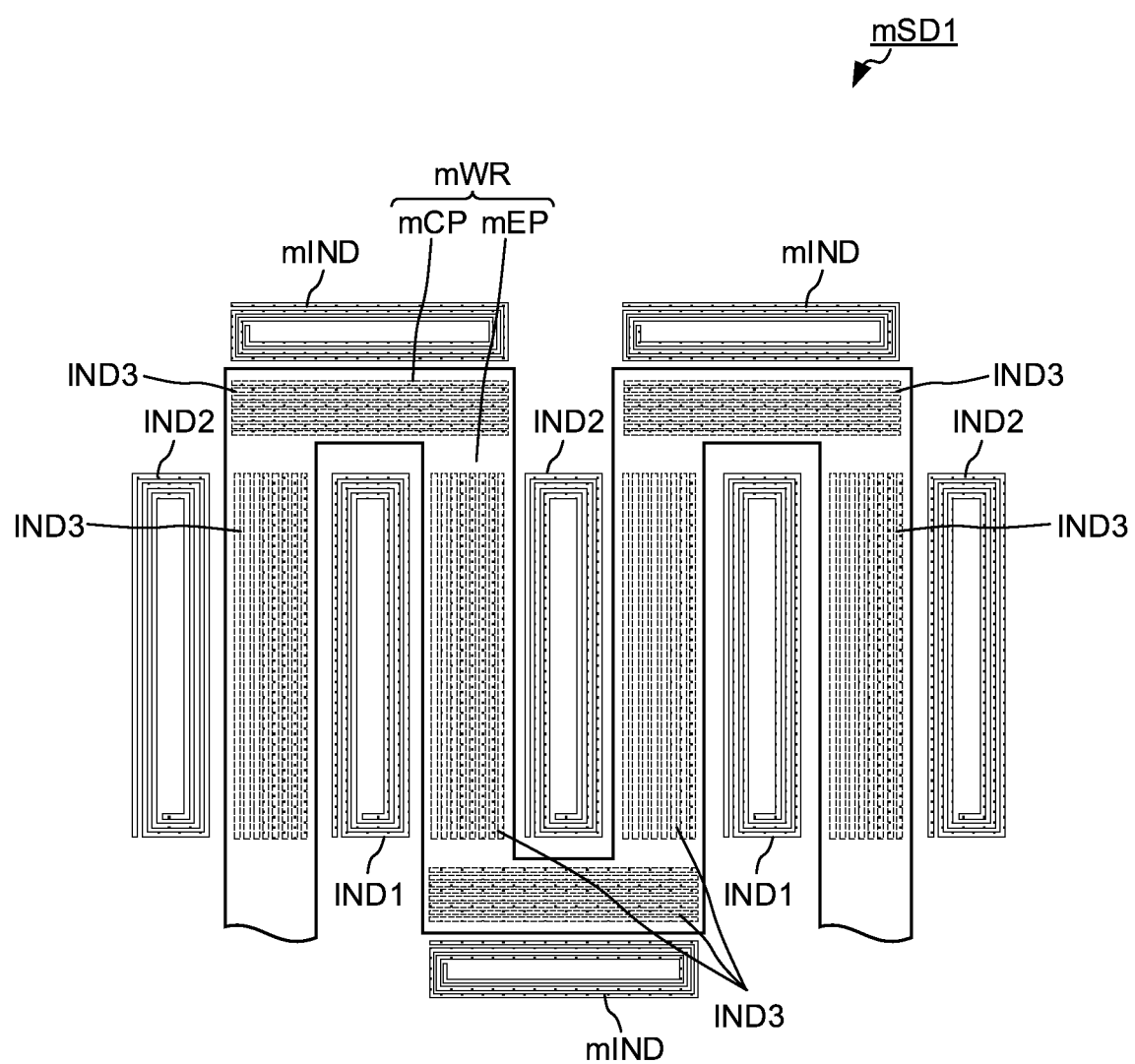
FIG. 7 is a plan view showing an exemplary configuration of a main portion of a semiconductor device according to a first modification of the first embodiment.

FIG. 7 is a plan view showing an exemplary configuration of a main portion of a semiconductor device mSD1 according to first modification of the present embodiment.

In the semiconductor device mSD1 according to first modification, a wiring mWR, in a plan view, includes a plurality of extending portions mEP and a plurality of connecting portions mCP which are integrally formed as a single member. The plurality of extending portions mEP are arranged in parallel such that the plurality of extending portions mEP extend along a first direction. The connecting portion mCP, when viewed in plan, connects the two extending portions mEP adjacent to each other, of the plurality of extending portions mEP, in a second direction perpendicular to the first direction.

The semiconductor device mSD1 includes a plurality of first inductors IND1, a plurality of second inductors IND2, a plurality of third inductors IND3, and a plurality of inductors mIND. The plurality of the inductors mIND are respectively formed such that the plurality of the inductors mIND are adjacent to the connecting portion mCP of the wiring mWR. The first inductor IND1, the second inductor IND2, the respective numbers of the third inductor IND3 and the inductor mIND can be appropriately adjusted in accordance with a shape and a length of the wiring mWR.

In the first modification, for example, the first inductor IND1 is formed such that the first inductor IND1 is, in a plan view, sandwiched by one extending portion mEP and another extending portion mEP. In this case, in the first inductor IND1, superimposed induced voltage is generated due to the magnetic field occurring in the one extending portion mEP, and the magnetic field occurring in the another extending portion mEP. Therefore, the semiconductor device mSD1 according to the first modification can detect the current with higher accuracy.

In the first modification, the plurality of the third inductors IND3 has been described when configured separately from each other, the plurality of the third inductors IND3 may be configured as a single member. The third inductor IND3 extends along the wiring WR in plan view.

Second Embodiment

A semiconductor device SD2 according to a second embodiment differs from the semiconductor device SD1 according to the first embodiment mainly in that the semiconductor device SD2 includes a fourth inductor IND4 and a fifth inductor IND5 constituting a differential inductor. Therefore, the same constituent elements as those of the semiconductor device SD1 according to the first embodiment are denoted by the same reference numerals, and descriptions thereof are omitted.

(Circuit Configuration of Semiconductor Device)

Figure 8:
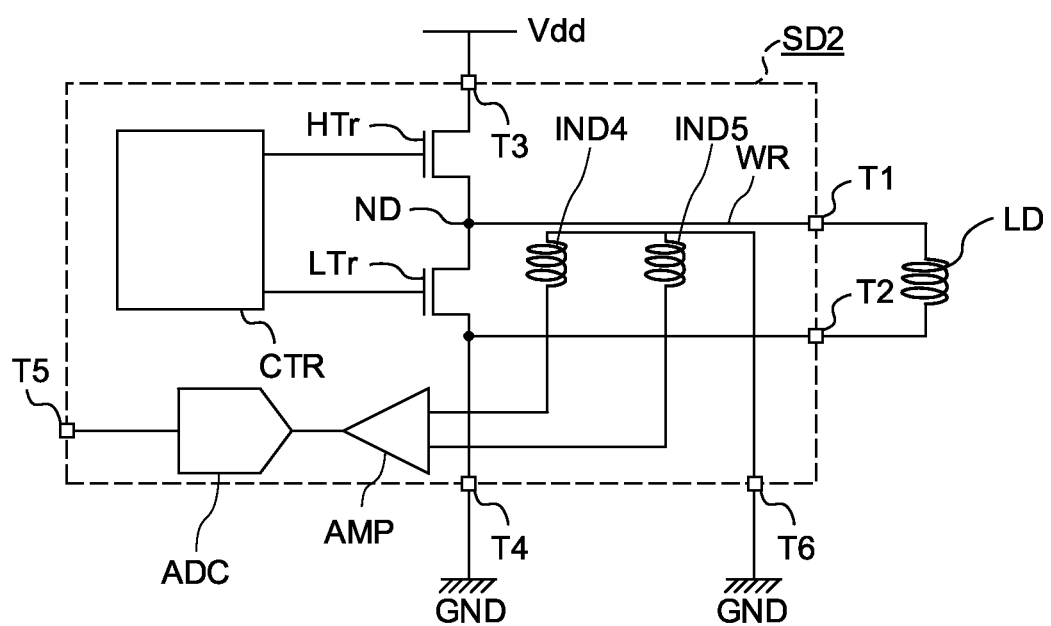
FIG. 8 is a circuit diagram showing an exemplary circuit configuration of a semiconductor device according to a second embodiment.

FIG. 8 is a circuit diagram showing an exemplary circuit configuration of a semiconductor device SD2 according to a second embodiment.

As shown in FIG. 8, the semiconductor device SD2 includes a controller CTR, a high-side transistor HTr, a low-side transistor LTr, a fourth inductor IND4, a fifth inductor IND5, an amplifier circuit AMP, and an AD conversion circuit ADC. In the semiconductor device SD2, the fourth inductor IND4 and the fifth inductor IND5 constitute a differential inductance. The fourth inductor IND4 and the fifth inductor IND5, via the sixth terminal T6 is electrically connected with a grounding wire GND.

The fourth inductor IND4 is configured to be electrically isolated from the wiring WR, and be magnetically connected with the wiring WR. The fourth inductor IND4 is electrically connected with the first input terminal of the amplifier circuit AMP. In the fourth inductor IND4, an electromotive voltage (induced electromotive voltage) is generated when a current is supplied in the wiring WR via the node ND.

The fifth inductor IND5 is also configured to be electrically isolated from the wiring WR, and be magnetically connected with the wiring WR. The fifth inductor IND5 is electrically connected with the fourth inductor IND4 such that the fourth inductor IND4 and the fifth inductor IND5 constitute the differential circuit. The fifth inductor IND5 may be directly connected with one end of the fourth inductor IND4, or may be indirectly connected one end of the fourth inductor IND4 via the grounding wire GND. In present embodiment, the fifth inductor IND5 is directly connected with one end of the fourth inductor IND4. Even in the fifth inductor IND5, when a current is supplied into the wiring WR via the node ND, an electromotive voltage (induced electromotive voltage) is generated.

In the second embodiment, the fourth inductor IND4 and the fifth inductor IND5 constitute the differential inductor. Thus, an influence of the noise can be removed. The fourth inductor IND4 and the fifth inductor IND5 are connected in parallel between the amplifier circuit AMP and the ground line GND.

In the second embodiment, the amplifier circuit AMP is electrically connected with the fourth inductor IND4 and the fifth inductor IND5. The first input terminal of the amplifier circuit AMP is electrically connected with the fourth inductor IND4. The second input terminal of the amplifier circuit AMP is electrically connected with the fifth inductor IND5.

(Method of Detecting Current)

An example of a method of operating the semiconductor device SD2 (a method of detecting current) is the same as the method of operating the semiconductor device SD1 according to the first embodiment. In the second embodiment, since the fourth inductor IND4 and the fifth inductor IND5 is differentially operated, it is possible to perform the current detecting with greater accuracy.

(Configuration of Semiconductor Device)

Figure 9:
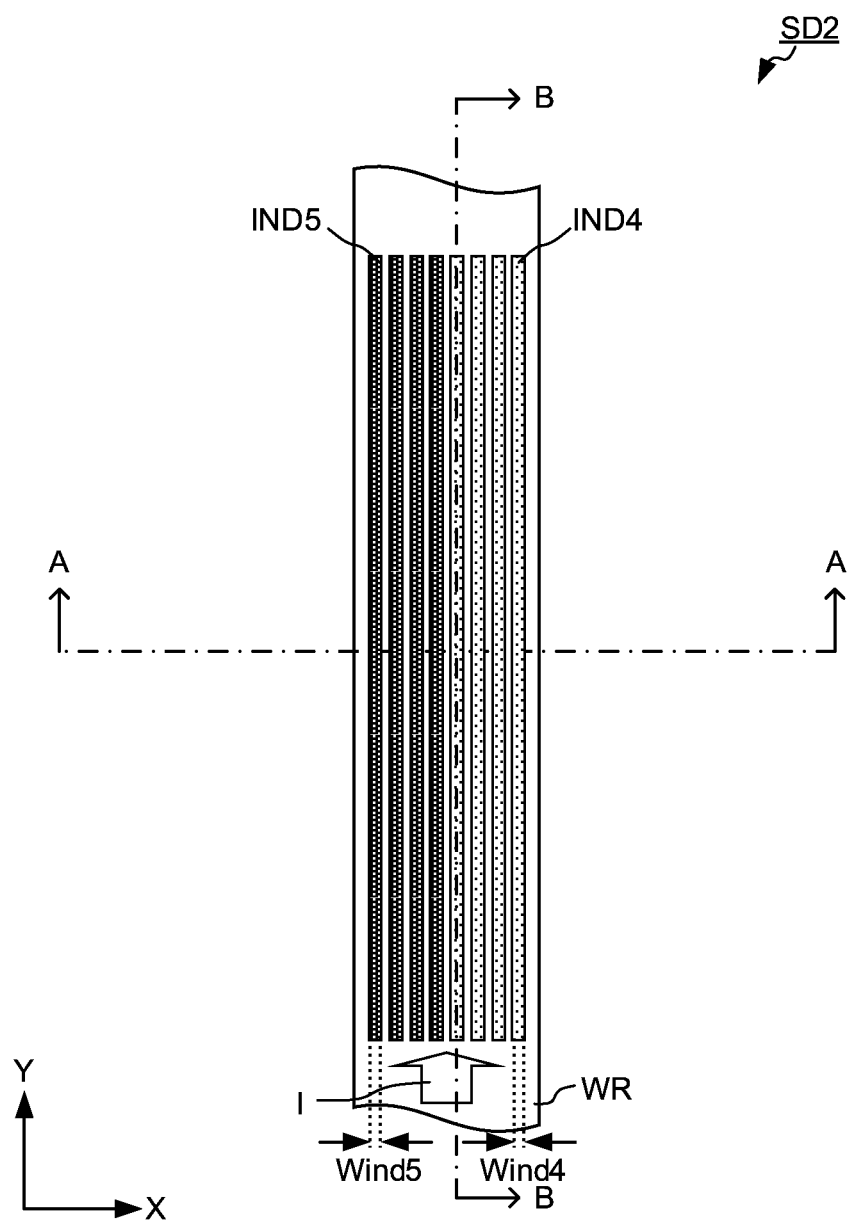
FIG. 9 is a plan view showing an exemplary configuration of the main portion of the semiconductor device according to the second embodiment.
Figure 10:
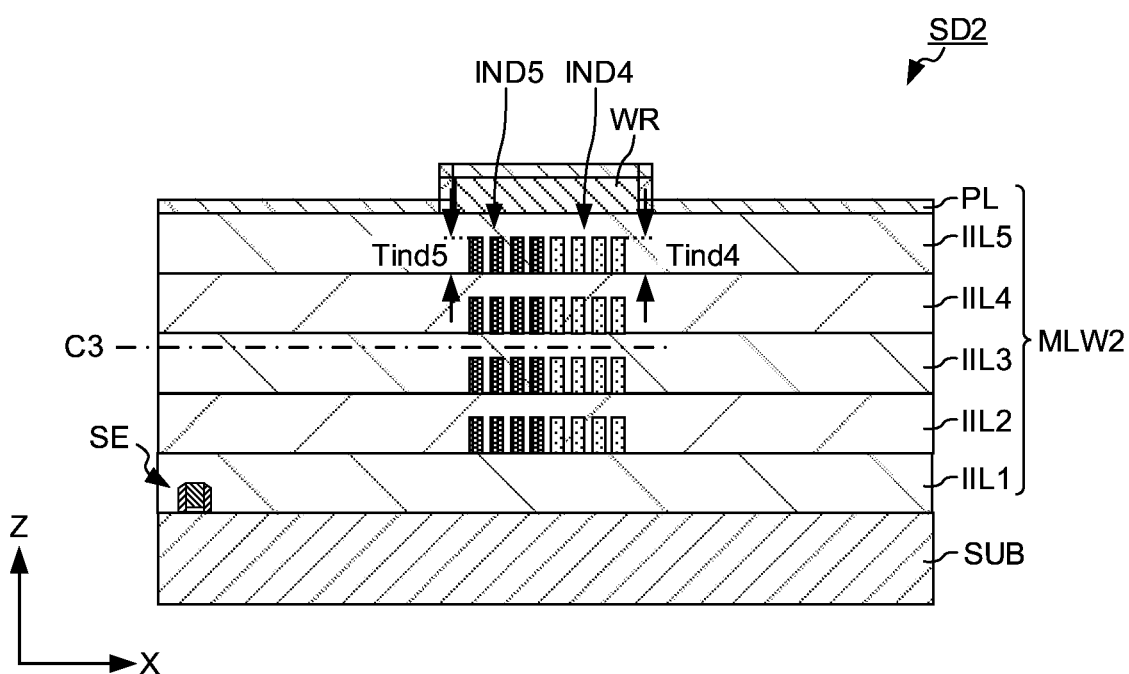
FIG. 10 is a cross-sectional view showing an exemplary configuration of the main portion of the semiconductor device according to the second embodiment.
Figure 11:
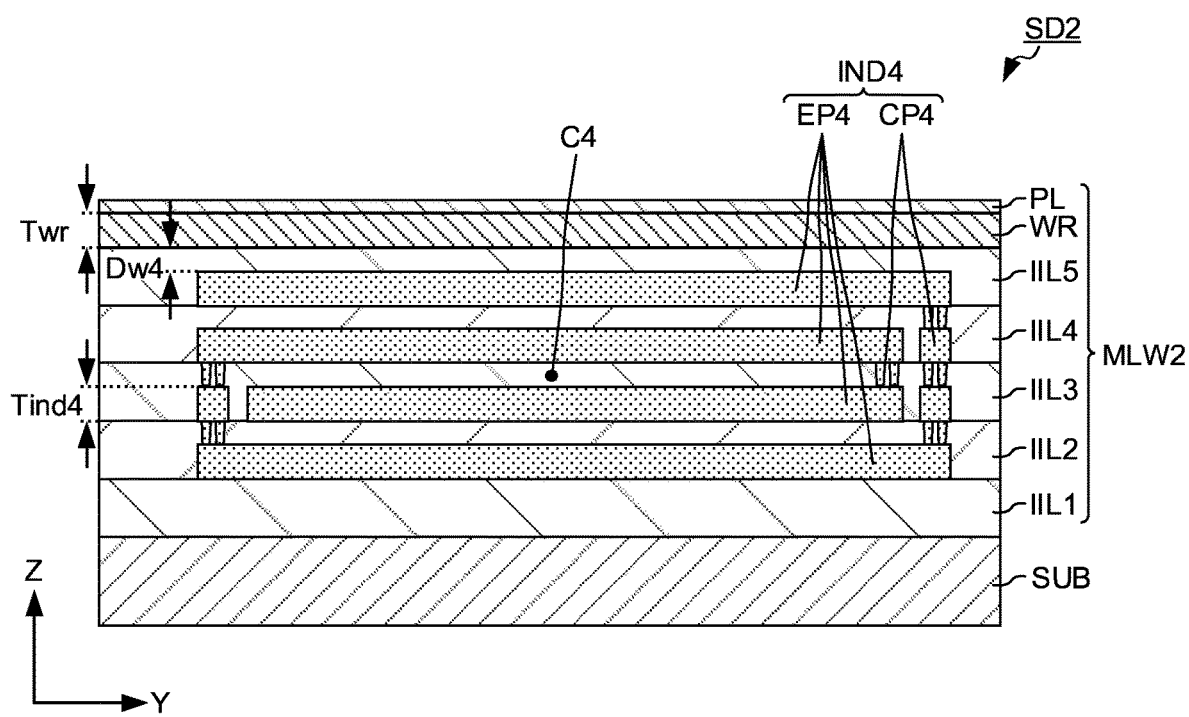
FIG. 11 is a cross-sectional view showing an exemplary configuration of the main portion of the semiconductor device according to the second embodiment.

FIG. 9 is a plan view showing an exemplary configuration of a main portion of the semiconductor device SD2 according to the second embodiment. FIG. 9 shows an exemplary configuration of the semiconductor device SD2 for realizing the above-described circuit configuration of the semiconductor device SD2. FIG. 10 and FIG. 11 are cross-sectional views showing an exemplary configuration of the main portion of the semiconductor device SD2 according to the second embodiment. FIG. 10 is a cross-sectional view taken along line A-A in FIG. 9. FIG. 11 is a cross-sectional view taken along line B-B in FIG. 9. In FIG. 9, from the viewpoint of legibility, only the fourth inductor IND4, the fifth inductor IND5 and wiring WRs are shown. Also, in FIGS. 9, 10 and 11, from the viewpoint of legibility, the fourth inductor IND4 is shown in thin crepe and the fifth inductor IND5 is shown in thick crepe.

The semiconductor device SD2 includes a semiconductor substrate SUB, a semiconductor element SE, and a multilayer wiring MLW2. The multilayer wiring MLW2 includes a first interlayer insulating layer IIL1, a second interlayer insulating layer IIL2, a third interlayer insulating layer IIL3, a fourth interlayer insulating layer IIL4, a fifth interlayer insulating layer IIL5, a wiring WR, a fourth inductor IND4, a fifth inductor IND5, and a protective layer PL.

For example, a thickness Twr of the wiring WR is preferably equal to or greater than a thickness Tind4 of the fourth inductor IND4 and a thickness Tind5 of the fifth inductor IND5. For example, a width Wwr of the wiring WR is preferably greater than a width Wind4 of the fourth inductor IND4 and a width Wind5 of the fifth inductor IND5.

The fourth inductor IND4 is configured to be electrically isolated from the wiring WR and be magnetically connected with the wiring WR. The fourth inductor IND4 is formed in a vicinity of the wiring WR without contacting the wiring WR. A configuration for the fourth inductor IND4 being magnetically connected to the wiring WR is appropriately adjusted in accordance with the current value of the current in the wiring WR, the winding number of the fourth inductor IND4, and a distance between the wiring WR and the fourth inductor IND4. Hereinafter, the configuration of the fourth inductor IND4 will be described in detail.

At least a portion of the fourth inductor IND4, in plan view, overlaps with a portion of the wiring WR. From the viewpoint of increasing the accuracy of the current detecting by the fourth inductor IND4, it is preferable that an entire of the fourth inductor IND4, in a plan view, overlaps with the portion of the wiring WR.

From the viewpoint of increasing the current detecting accuracy by the fourth inductor IND4, in the Z-direction, a distance Dw4 between the fourth inductor IND4 and the wiring WR is preferably small. For example, the distance Dw4 is preferably less than the thickness Twr of the wiring WR. The distance Dw4 is, for example, preferably 1 μm or less, and more preferably 0.5 μm or less. On the other hand, from the viewpoint of suppressing the short circuit between the fourth inductor IND4 and the wiring WR, it is preferable that the distance Dw4 is large. The distance Dw4 is, for example, preferably 0.8 μm or more, and more preferably 1 μm or more. The distance Dw4 is appropriately adjusted in accordance with the current value of the current supplied in the wiring WR.

The fourth inductor IND4 may be formed in a layer closer to the semiconductor substrate SUB than a layer in which the wiring WR is formed, or may be formed in a layer farther from the semiconductor substrate SUB than the layer in which the wiring WR is formed. It is preferable that the wiring WR is formed in an uppermost layer in the multilayer wiring MLW2 from the viewpoint of increasing the current quantity in the wiring WR and improving the accuracy of the current detecting. That is, the fourth inductor IND4 is preferably formed in a layer of the multilayer wiring MLW2 closer to the semiconductor substrate SUB than the layer in which the wiring WR is formed. In the second embodiment, the fourth inductor IND4 is formed in the second interlayer insulating layer IIL2, the third interlayer insulating layer IIL3, the fourth interlayer insulating layer IIL4, and the fifth interlayer insulating layer IIL5.

From the viewpoint of increasing the accuracy of the current detecting, the winding number of the fourth inductor IND4 is preferably large. The winding number of the fourth inductor IND4 may be adjusted in accordance with a magnitude of the current value of the current supplied into the wiring WR. For example, if the current value of the current supplied into wiring WR is small, it is preferable that the winding number of the fourth inductor IND4 is large. The winding number of the fourth inductor IND4 is appropriately adjusted in accordance with the width Wwr of wiring WR. The winding number of the fourth inductor IND4 is, for example, preferably 50 or more, and more preferably 130 or more.

From the viewpoint of reducing the resistance of the fourth inductor IND4, it is preferable that a thickness Tind4 of the fourth inductor IND4 is large. The thickness Tind4 of the fourth inductor IND4 is preferably 0.2 μm or more, more preferably 0.3 μm or more.

From the viewpoint of reducing the resistance of the fourth inductor IND4, it is preferable that a width Wind4 of the fourth inductor IND4 is large. The width Wind4 of the fourth inductor IND4 is preferably 0.18 μm or more, more preferably 0.24 μm or more. From the viewpoint of increasing the winding number of the fourth inductor IND4 without increasing an area occupied by the fourth inductor IND4, it is preferable that the width Wind4 of the fourth inductor IND4 is small. For example, the width Wind4 of the fourth inductor IND4 is preferably smaller than the width Wwr of the wiring WR. The width Wind4 of the fourth inductor IND4 is preferably 1 μm or less, more preferably 0.5 μm or less.

In the second embodiment, the fourth inductor IND4 includes the plurality of extending portions EP4 and the plurality of connecting portions CP4. Further, although not shown in particular, the fourth inductor IND4 also includes a wiring for connecting the two extending portions EP4 adjacent to each other in the same layer.

The plurality of extending portions EP4 are respectively formed on each of the interlayer insulating layer. Examples of the material of the extending portion EP4 are similar to the material of the wiring WR. The extending portion EP4, in plan view, extends along the Y-direction. In plan view, when the extending portion EP4 extends along the wiring WR, the interaction between the magnetic field and the fourth inductor IND4 caused by the current flowing via the wiring WR is increased. From the viewpoint of increasing the accuracy of the current detecting, it is preferable that the extending portion EP4 extends along the wiring WR.

From the viewpoint of improving the accuracy of current sensing, it is preferable that the length of the extending portion EP4 in the Y-direction is large. For example, the length of the extending portion EP4 in the Y direction is preferably greater than the length of the connecting portion CP4 in the Z direction. The greater the length of the extending portion EP4, the greater the magnetic interaction with wiring WR, because the induced electromotive voltage increases.

The connecting portion CP4 connects two extending portions EP4 adjacent to each other. The connecting portion CP4 is formed of a wiring and a via. In the connecting portion CP4, one or more of wiring and one or more of the vias are alternately formed. The connecting portion CP3 may be formed of only vias. As a configuration of the first via, a configuration adopted as a via in the semiconductor technology can be adopted. The first via includes, for example, a barrier film and a conductive film formed on the barrier film. Examples of materials for the barrier film include titanium (Ti), titanium nitride (TiN), tantalum (Ta), and tantalum nitride (TaN). The material of the conductive film is, for example, tungsten (W), aluminum (Al), or copper (Cu).

A shape of the fourth inductor including a plurality of extending portion EP4 and a plurality of connecting portion CP4, in a cross section through wiring WR and along the Y direction, is a spiral shape. As shown in FIG. 10 and FIG. 11, a central axis C4 of the fourth inductor IND4, in the cross section, located on the center of an area surrounded by the two extending portions EP4 (wiring) and two connecting portions CP4 (wiring and via) which are located at innermost of the fourth inductor IND4. The center axis C4 of the fourth inductor IND4 is along the main surface of the semiconductor substrate SUB.

The shape of the fourth inductor IND4, as described above, is a spiral shape. More specifically, the shape of the fourth inductor IND4, when viewing the fourth inductor IND4 from the central axis C4 of the fourth inductor IND4, it is preferable that a substantially rectangular shape. Thus, as compared with when the shape of the fourth inductor IND4 is a square shape, it is possible to increase the length of the extending portion EP4 in the Y direction, it is possible to increase the accuracy of the current detecting.

The fifth inductor IND5 is configured to be electrically isolated from the wiring WR and be magnetically connected with the wiring WR. A configuration of the fifth inductor IND5, except for the position, is the same as the configuration of the fourth inductor IND4. More specifically, the elements (extending portion EP5 and the connecting portion CP5) of the fifth inductor IND5, the width Wind5 of the fifth inductor IND5, the winding number of the fifth inductor IND5, a distance between the fifth inductor IND5 and the wiring WR, the configuration such as the shape of the fifth inductor IND5 is the same as the configuration of the fourth inductor IND4.

The fifth inductor IND5 is also configured to be electrically isolated from the wiring WR and is magnetically connected with the wiring WR. The fifth inductor IND5 is formed in a vicinity of the wiring WR without contacting the wiring WR. When viewed in plan, the fifth inductor IND5, in the X-direction, adjacent to the fourth inductor IND4. At least a portion of the fifth inductor IND5, in plan view, overlaps with another portion of the wiring WR. From the viewpoint of increasing the current detecting accuracy by the fifth inductor IND5, it is preferable that an entire of the fifth inductor IND5, in a plan view, overlaps with the another (the other) portion of the wiring WR.

As described above, the fifth inductor IND5 is configured to be differentially operated with the fourth inductor IND4. For this reason, it is preferable that the fifth inductor IND5 is formed in magnetically the same environmental as the fourth inductor IND4. Therefore, the fifth inductor IND5 is formed in the vicinity of the fourth inductor IND4. In the second embodiment, the fifth inductor IND5, when viewed in plan view, is formed such that the fifth inductor IND5 is adjacent to the fourth inductor IND4 in the width direction of the wiring WR.

It is sufficient that fifth inductor IND5 is electrically connected with the fourth inductor IND4 such that the differential operation with the fourth inductor IND4. Therefore, the winding direction of the fifth inductor IND5 may be the same as the winding direction of the fourth inductor IND4, may be different.

(Effect)

The second embodiment has the same effects as the first embodiment. Furthermore, the semiconductor device SD2 according to the second embodiment includes the fourth inductor IND4 and the fifth inductor IND5 configured to differentially operate. Therefore, it is possible to reduce the influence of noise. Consequently, the characteristics of the semiconductor device SD2 can be further enhanced.

First Modification of Second Embodiment

Figure 12:
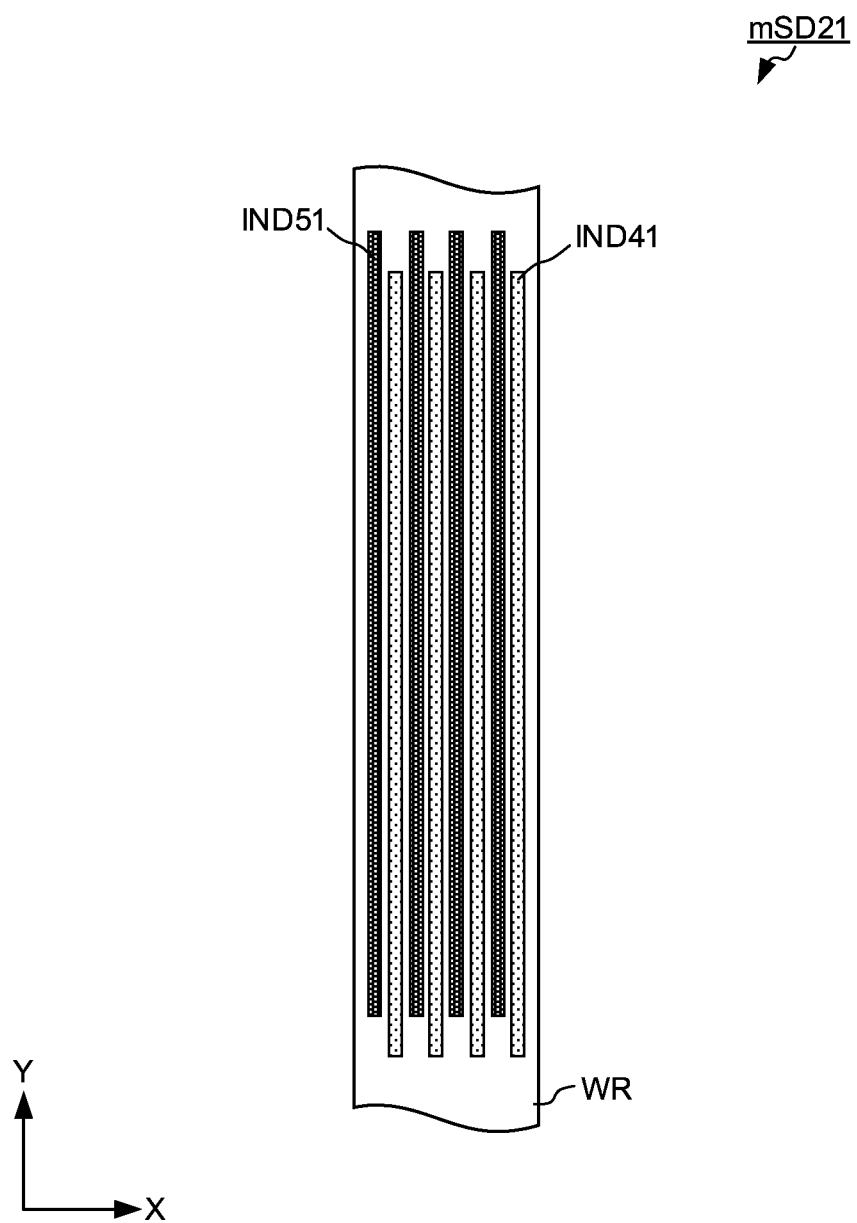
FIG. 12 is a plan view showing an exemplary configuration of the main portion of the semiconductor device according to a first modification of the second embodiment.

FIG. 12 is a plan view showing an exemplary configuration of a main portion of a semiconductor device mSD21 according to first modification of the second embodiment.

In the semiconductor device mSD21 according to first modification, a fourth inductor mIND41 and a fifth inductor mIND51, in the X-direction, a portion of the fourth inductor mIND41, and a portion of the fifth inductor mIND51 overlap with each other. Although not shown in particular, in the X direction, in a portion that does not overlap the fifth inductor mIND51, of the fourth inductor mIND41, a connecting portion, in the X direction, connecting a portion of the fourth inductor mIND41 with another portion of the fourth inductor mIND41 is formed. The same applies to the fifth inductor mIND51.

In the first modification, the fourth inductor mIND41 and the fifth inductor mIND51 can be formed in magnetically closer environment. Thus, a differential signal with higher accuracy is obtained. As a result, the semiconductor device mSD21 according to first modification can be made more noise-tolerant.

Second Modification of Second Embodiment

Figure 13:
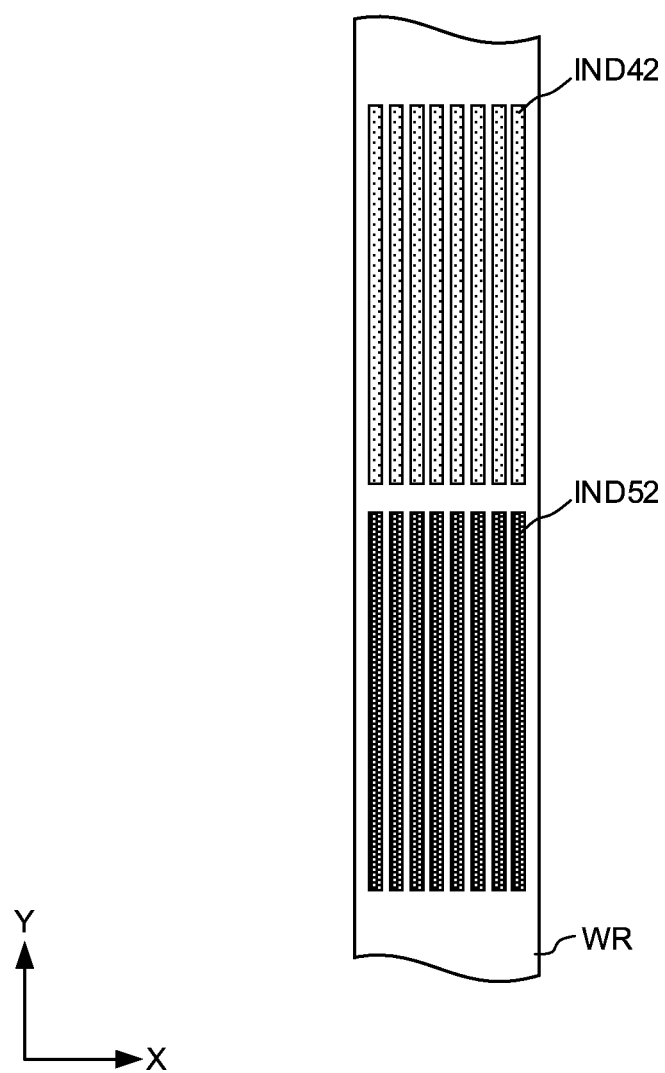
FIG. 13 is a plan view showing an exemplary configuration of a main portion of a semiconductor device according to a second modification of the second embodiment.

FIG. 13 is a plan view showing an exemplary configuration of a main portion of a semiconductor device mSD22 according to a second modification of the second embodiment.

In the semiconductor device mSD22 according to the second modification, in the Y-direction, a fourth inductor mIND42 and a fifth inductor mIND52 are arranged such that the inductor mIND42 and a fifth inductor mIND52 are adjacent to each other. This provides the same effects as first modification of the second embodiment.

Third Modification of Second Embodiment

Figure 14:
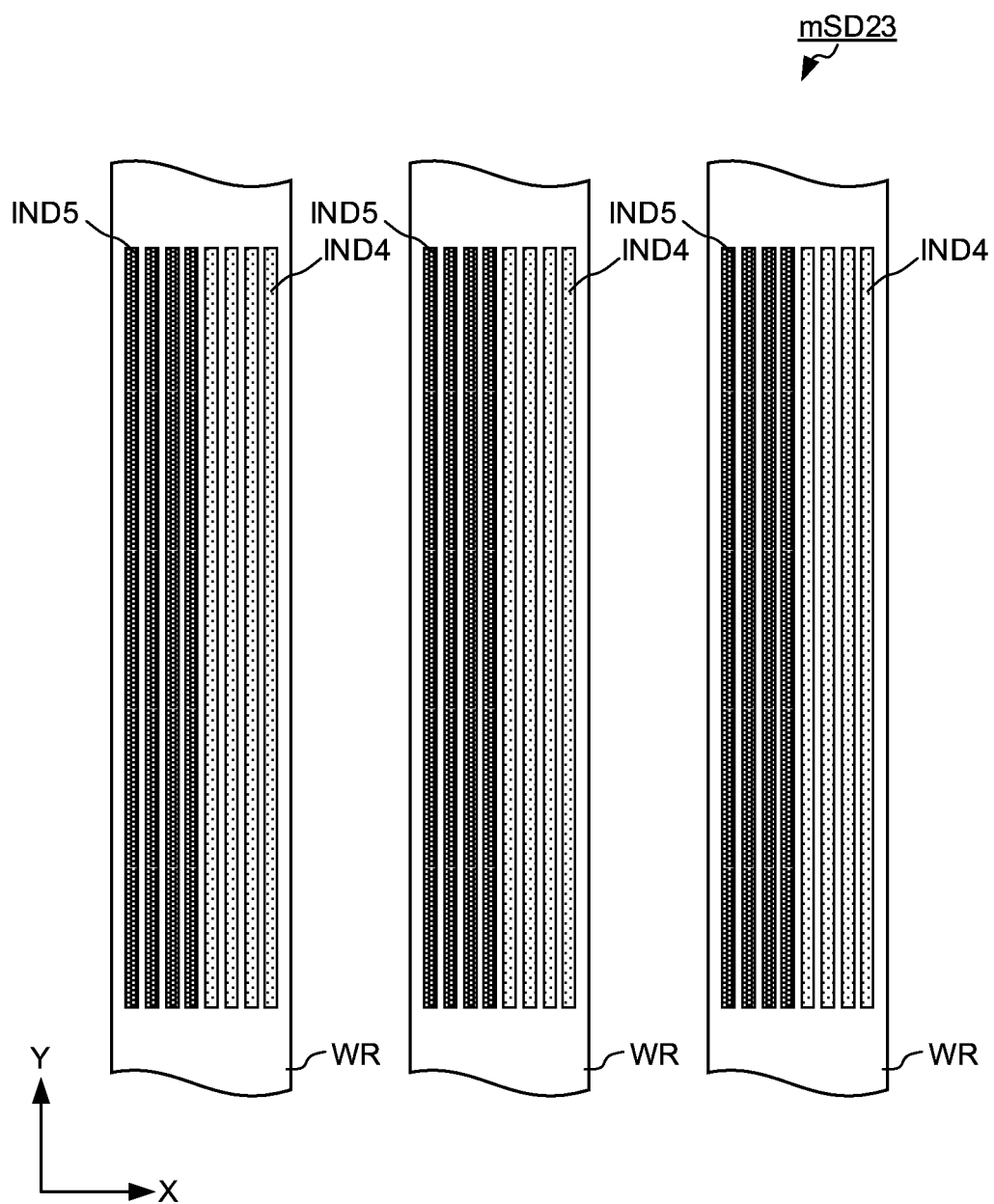
FIG. 14 is a plan view showing an exemplary configuration of a main portion of a semiconductor device according to a third modification of the second embodiment.

FIG. 14 is a plan view showing an exemplary configuration of a main portion of a semiconductor device mSD23 according to a third modification of the second embodiment.

A semiconductor device mSD23 according to the third modification includes a plurality of wirings WR connected in parallel with each other. Thus, the magnitude of the current supplied to each of the plurality of wirings WR can be adjusted.

It should be noted that the present invention is not limited to the above-mentioned embodiments, and various modifications can be made without departing from the gist thereof. For example, the semiconductor device SD1 may include at least one of the first inductor IND1, the second inductor IND2 and the third inductor IND3.

Further, the inductor may be constituted by a plurality of wirings (the extending portion) having the same thickness to each other, or may be constituted by a plurality of wirings (the extending portion) having different thicknesses from each other.

The material of the inductor may be the same as the material of the wiring WR or different from the material of the wiring WR. The material of the inductor and the material of the wiring WR may be copper or aluminum. The material of the inductor is copper, and the material of the wiring WR may be aluminum. The material of the inductor is aluminum, and the material of the wiring WRs may be copper.

In addition, at least a portion of each of the embodiments and at least a portion of each modification may be arbitrarily combined with each other. For example, the semiconductor device SD1 according to the first embodiment may include a plurality of wirings WR connected in parallel with each other.

In addition, even when a specific numerical value example is described, it may be a numerical value exceeding the specific numerical value, or may be a numerical value less than the specific numerical value, except when it is theoretically obviously limited to the numerical value. In addition, the component means "B containing A as a main component" or the like, and the mode containing other components is not excluded.

What is claimed is:

1. A semiconductor device comprising:
   a semiconductor substrate;
   a semiconductor element formed on the semiconductor substrate; and
   a multilayer wiring formed on the semiconductor substrate such that the multilayer wiring covers the semiconductor element, the multilayer wiring comprising:
      a wiring electrically connected with the semiconductor element; and
      a first inductor,
   wherein the first inductor is configured to be electrically isolated from the wiring and be magnetically connected with the wiring,
   wherein the first inductor comprises:
      a plurality of extending portions extending along a first direction which is an extending direction of the wiring; and
      a plurality of connecting portions respectively connecting two adjacent extending portions with each other.

2. The semiconductor device according to claim 1,
   wherein a first central axis of the first inductor is along a normal line to a main surface of the semiconductor substrate.

3. The semiconductor device according to claim 2,
   wherein the first inductor, in plan view, is adjacent to the wiring in a width direction of the wiring.

4. The semiconductor device according to claim 3,
   wherein a shape of a region surrounded by a peripheral portion of the first inductor is substantially rectangular shape or substantially oval shape when the first inductor is viewed from the first central axis.

5. The semiconductor device according to claim 1,
   wherein a first central axis of the first inductor is along a main surface of the semiconductor substrate.

6. The semiconductor device according to claim 5,
   wherein at least a portion of the first inductor overlaps with the wiring in a plan view.

7. The semiconductor device according to claim 6,
   wherein a shape of a region surrounded by a peripheral portion of the first inductor is substantially rectangular shape or substantially oval shape when the first inductor is viewed from the first central axis.

8. The semiconductor device according to claim 1,
   wherein the multilayer wiring comprises a second inductor configured to be electrically isolated from the wiring and be magnetically connected with the wiring,
   wherein the second inductor is electrically connected with the first inductor, and
   wherein a first central axis of the first inductor and a second central axis of the second inductor are along a main surface of the semiconductor substrate.

9. The semiconductor device according to claim 1,
   wherein the multilayer wiring comprises a second inductor configured to be electrically isolated from the wiring and be magnetically connected with the wiring,
   wherein the second inductor is electrically connected with the first inductor, and
   wherein a first central axis of the first inductor and a second central axis of the second inductor are along a normal line to a main surface of the semiconductor substrate.

10. The semiconductor device according to claim 9,
    wherein the multilayer wiring comprises a third inductor configured to be electrically isolated from the wiring and be magnetically connected with the wiring,
    wherein the third inductor is electrically connected with the first inductor and the second inductor, and
    wherein a third central axes of the third inductor is along the main surface of the semiconductor substrate.

11. The semiconductor device according to claim 8,
    wherein the first inductor and the second inductor are configured to operate differentially.

12. The semiconductor device according to claim 9,
    wherein the first inductor and the second inductor are configured to operate differentially.

13. The semiconductor device according to claim 8, comprising:
    an amplifier circuit electrically connected with the first inductor; and
    an analog-digital (AD) conversion circuit electrically connected with the amplifier circuit.

14. The semiconductor device according to claim 9, comprising:
    an amplifier circuit electrically connected with the first inductor; and
    an analog-digital (AD) conversion circuit electrically connected with the amplifier circuit.

15. The semiconductor device according to claim 13,
    wherein the first inductor is configured to magnetically connected with the wiring when a current having a current density of $1\times10^5$ A/$\mu$m$^2$ or more flows in the wiring.

16. The semiconductor device according to claim 14,
    wherein the first inductor is configured to magnetically connected with the wiring when a current having a current density of $1\times10^5$ A/$\mu$m$^2$ or more flows in the wiring.

17. A method comprising:
    (a) providing a semiconductor device comprising a multilayer wiring in which a wiring and an inductor are formed;
    (b) supplying a current into the wiring; and
    (c) detecting an electromotive voltage generated in the inductor when the current is supplied into the wiring,
    wherein the inductor is configured to be electrically isolated from the wiring and be magnetically connected with the wiring, and wherein the inductor comprises:
a plurality of extending portions extending along a first direction which is an extending direction of the wiring; and
a plurality of connecting portions respectively connecting two adjacent extending portions with each other.

18. The method according to claim 17,
wherein, in the (c), the electromotive voltage generated in the inductor is amplified.

19. The method according to claim 18,
Wherein, in the (b), the current is supplied so that a current density in the wiring is $1 \times 10^5$ A/$\mu$m$^2$ or more.

20. A semiconductor device comprising:
a semiconductor substrate;
a semiconductor element formed on the semiconductor substrate; and
a multilayer wiring formed on the semiconductor substrate such that the multilayer wiring covers the semiconductor element, the multilayer wiring comprising:
a wiring electrically connected with the semiconductor element;
a first inductor; and
a second inductor,
wherein the first inductor is configured to be electrically isolated from the wiring and be magnetically connected with the wiring,
wherein the second inductor is configured to be electrically isolated from the wiring and be magnetically connected with the wiring,
wherein the second inductor is electrically connected with the first inductor, and
wherein a first central axis of the first inductor and a second central axis of the second inductor are along a main surface of the semiconductor substrate.

\* \* \* \* \*